(12) United States Patent
Yamazaki et al.

(10) Patent No.: US 8,492,840 B2
(45) Date of Patent: Jul. 23, 2013

(54) SEMICONDUCTOR DEVICE HAVING AN OXIDE SEMICONDUCTOR LAYER

(75) Inventors: Shunpei Yamazaki, Setagaya (JP); Hiromichi Godo, Isehara (JP); Hideomi Suzawa, Atsugi (JP); Shinya Sasagawa, Chigasaki (JP); Motomu Kurata, Isehara (JP); Mayumi Mikami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 153 days.

(21) Appl. No.: 13/008,285

(22) Filed: Jan. 18, 2011

(65) Prior Publication Data

US 2011/0180796 A1    Jul. 28, 2011

(30) Foreign Application Priority Data

Jan. 22, 2010 (JP) .................... 2010-012540

(51) Int. Cl.
*H01L 27/12* (2006.01)
(52) U.S. Cl.
USPC .................... 257/347; 257/E29.14
(58) Field of Classification Search
USPC ............................ 257/347, E29.14
See application file for complete search history.

(56) References Cited

U.S. PATENT DOCUMENTS

| | | |
|---|---|---|
| 5,648,662 A | 7/1997 | Zhang et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

International Search Report (Application No. PCT/JP2010/073886) Dated Feb. 15, 2011.

(Continued)

*Primary Examiner* — Howard Weiss
*Assistant Examiner* — Steven Rao
(74) *Attorney, Agent, or Firm* — Eric J. Robinson; Robinson Intellectual Property Law Office, P.C.

(57) ABSTRACT

An object is to provide a semiconductor device including an oxide semiconductor, which maintains favorable characteristics and achieves miniaturization. The semiconductor device includes an oxide semiconductor layer, a source electrode and a drain electrode in contact with the oxide semiconductor layer, a gate electrode overlapping with the oxide semiconductor layer, and a gate insulating layer provided between the oxide semiconductor layer and the gate electrode, in which the source electrode and the drain electrode each include a first conductive layer, and a second conductive layer having a region which extends in a channel length direction from an end portion of the first conductive layer.

23 Claims, 13 Drawing Sheets

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0146452 A1 | 8/2003 | Chiang |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1* | 8/2007 | Furuta et al. ............... 257/347 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048183 A1 | 2/2008 | Ohsawa et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134383 A1 | 5/2009 | Imahayashi et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0297809 A1 | 11/2010 | Imahayashi et al. |
| 2011/0193080 A1 | 8/2011 | Yamazaki et al. |
| 2011/0210326 A1 | 9/2011 | Suzawa et al. |

FOREIGN PATENT DOCUMENTS

| | | |
|---|---|---|
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| WO | WO-2004/114391 | 12/2004 |
| WO | WO-2007/058329 | 5/2007 |
| WO | WO-2007/089048 | 8/2007 |
| WO | WO-2007/142167 | 12/2007 |

OTHER PUBLICATIONS

Written Opinion (Application No. PCT/JP2010/073886) Dated Feb. 15, 2011.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv.Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 :Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,Or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)m$) ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

* cited by examiner

FIG. 6A1
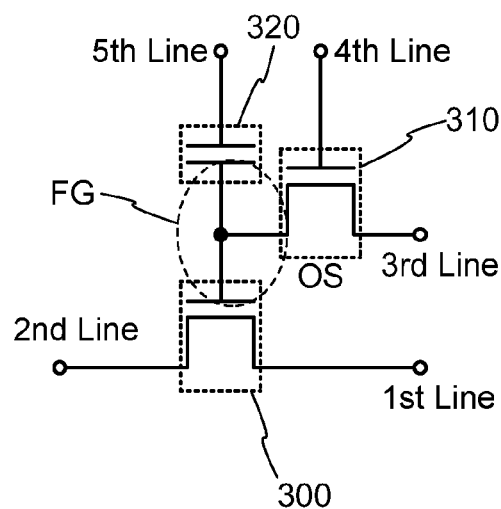
FIG. 6B
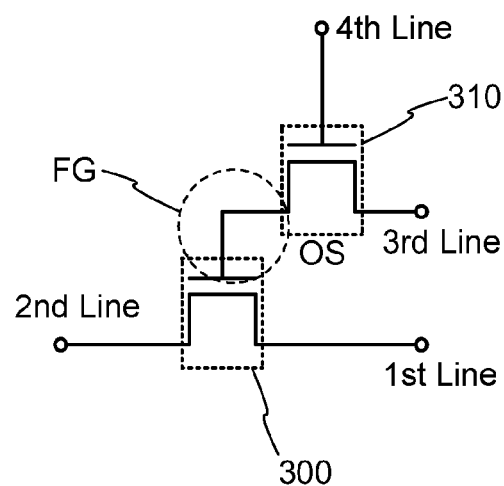
FIG. 6A2
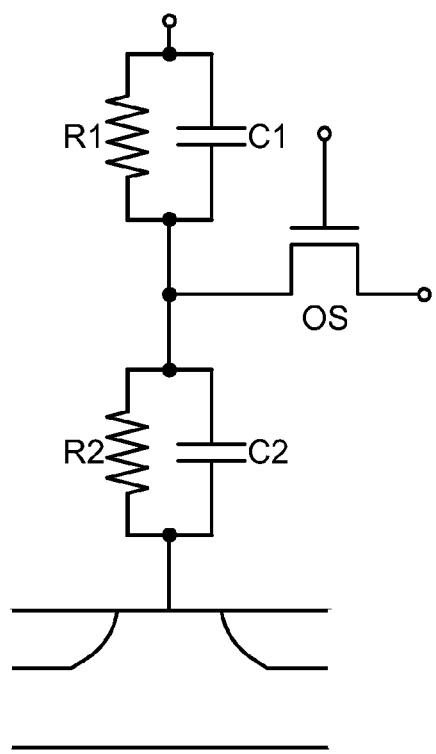

SEMICONDUCTOR DEVICE HAVING AN OXIDE SEMICONDUCTOR LAYER

TECHNICAL FIELD

A technical field of the present invention relates to a semiconductor device. Note that semiconductor devices herein refer to general elements and devices which function by utilizing semiconductor characteristics.

BACKGROUND ART

There are a wide variety of metal oxides and such metal oxides are used for various applications. Indium oxide is a well-known material and has been used for transparent electrodes required in liquid crystal display devices or the like.

Some metal oxides have semiconductor characteristics. The examples of such metal oxides having semiconductor characteristics are, for example, tungsten oxide, tin oxide, indium oxide, zinc oxide, and the like. A thin film transistor in which a channel formation region is formed using such metal oxides is already known (for example, see Patent Documents 1 to 4, Non-Patent Document 1, and the like).

As metal oxides, not only single-component oxides but also multi-component oxides are known. For example, $InGaO_3(ZnO)_m$ (m: natural number) having a homologous phase is known as a multi-component oxide semiconductor including In, Ga, and Zn (for example, see Non-Patent Documents 2 to 4 and the like).

Furthermore, it is confirmed that an oxide semiconductor including such an In—Ga—Zn-based oxide is applicable to a channel formation region of a thin film transistor (for example, see Patent Document 5, Non-Patent Documents 5 and 6, and the like).

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

In order to achieve high-speed operation, low power consumption, cost reduction, or the like of a transistor, it is necessary to miniaturize a transistor.

In the case where a transistor is miniaturized, defects generated in a manufacturing process become a major problem. For example, each of a source electrode and a drain electrode and a channel formation region are electrically connected; however, disconnections, poor connections, and the like may occur due to a decrease in coverage by the miniaturization.

In addition, in the case where a transistor is miniaturized, a problem of a short-channel effect is also caused. The short-channel effect refers to degradation of electrical characteristics which becomes obvious with miniaturization of a transistor (a reduction in channel length (L)). The short-channel effect results from the effect of an electric field of a drain electrode on a source electrode. Specific examples of the short-channel effect are a decrease in threshold voltage, an increase in subthreshold swing (S value), an increase in leakage current, and the like. In particular, it is known that a transistor including an oxide semiconductor has smaller off current at a room temperature as compared to a transistor including silicon. This is attributed to the fact that carriers generated by thermal excitation are small, that is, carrier density is small. In the transistor in which a material whose carrier density is small is used as described above, a short-channel effect such as a decrease in a threshold voltage tends to be caused easily.

Thus, according to an embodiment of the disclosed invention, it is an object of the present invention to provide a semiconductor device which achieves miniaturization while the defects are suppressed. Further, it is another object of the present invention to provide a semiconductor device which achieves miniaturization while favorable characteristics are maintained.

One embodiment of the disclosed invention is a semiconductor device which includes an oxide semiconductor layer, a source electrode and a drain electrode in contact with the oxide semiconductor layer, a gate electrode overlapping with the oxide semiconductor layer, and a gate insulating layer provided between the oxide semiconductor layer and the gate electrode, in which the source electrode and the drain electrode each include a first conductive layer, and a second conductive layer having a region which extends in a channel length direction from an end portion of the first conductive layer.

In the above semiconductor device, each of the first conductive layer and the second conductive layer preferably has a tapered shape.

In the above semiconductor device, sidewall insulating layers are preferably provided over the regions of each of the second conductive layer.

Another embodiment of the disclosed invention is a semiconductor device which includes an oxide semiconductor layer, a source electrode and a drain electrode in contact with the oxide semiconductor layer, a gate electrode overlapping with the oxide semiconductor layer, and a gate insulating layer provided between the oxide semiconductor layer and the gate electrode, in which the source electrode and the drain electrode each include a first conductive layer and a second conductive layer having a higher resistance than the first conductive layer, where the second conductive layer is in contact with the oxide semiconductor layer.

Another embodiment of the disclosed invention is a semiconductor device which includes an oxide semiconductor layer, a source electrode and a drain electrode in contact with the oxide semiconductor layer, a gate electrode overlapping with the oxide semiconductor layer, and a gate insulating layer provided between the oxide semiconductor layer and the gate electrode, in which the source electrode and the drain electrode each include a first conductive layer and a second conductive layer having a higher resistance than the first conductive layer, where the second conductive layer and the first conductive layer are in contact with the oxide semiconductor layer.

In the above semiconductor device, the second conductive layer is preferably a nitride of a metal.

In the above semiconductor device, the thickness of the second conductive layer is preferably from 5 nm to 15 nm.

Another embodiment of the disclosed invention is a semiconductor device which includes an oxide semiconductor layer including a channel formation region, a source electrode and a drain electrode in contact with the channel formation region, a gate electrode overlapping with the channel formation region, and a gate insulating layer provided between the oxide semiconductor layer and the gate electrode, in which a region in each of the source electrode and the drain electrode in contact with the channel formation region of the oxide semiconductor layer has a higher resistance than other regions.

In the above semiconductor device, each of the source electrode and the drain electrode is in contact with the oxide semiconductor layer at an end portion thereof, and an insulating layer is provided between the source electrode and the oxide semiconductor layer or between the drain electrode and the oxide semiconductor layer.

Note that semiconductor devices herein refer to general devices which function by utilizing semiconductor characteristics. For example, a display device, a memory device, an integrated circuit, and the like are included in the category of the semiconductor device.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source electrode" and a "drain electrode" are sometimes replaced with each other when a transistor of opposite polarity is used or when the direction of current flowing is changed in circuit operation, for example. Therefore, the terms "source electrode" and "drain electrode" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

According to one embodiment of the disclosed invention, either of the following effects or both of the effects can be obtained.

First, each of the source electrode and the drain electrode is formed to have a stacked structure including the first conductive layer and the second conductive layer, a region which extends in the channel length direction from an end portion of the first conductive layer is provided; thus, coverage in forming a semiconductor layer over the source electrode and the drain electrode is improved. Therefore, occurrence of poor connections or the like can be prevented.

Second, in the source electrode or the drain electrode, a vicinity of the region in contact with the channel formation region can be high-resistance region, whereby an electric field between the source electrode and the drain electrode can be relieved. Thus, the short-channel effect such as a decrease in a threshold voltage can be suppressed.

With such an effect, a problem accompanied with miniaturization can be resolved. As a result, the size of a transistor can be sufficiently reduced. By sufficiently reducing the size of the transistor, an area of a semiconductor device including the transistor is decreased, and the number of semiconductor devices obtained from one substrate is increased. Accordingly, manufacturing costs of the semiconductor device can be reduced. Further, since the semiconductor device is downsized, the semiconductor device which is substantially the same in size with further increased function can be realized. Furthermore, effects of high-speed operation, low power consumption, and the like of a transistor can be obtained in accordance with a reduction in channel length. Thus, miniaturization of a transistor including an oxide semiconductor can be achieved according to an embodiment of the disclosed invention, and various effects accompanied with the miniaturization can be obtained.

As described above, according to an embodiment of the disclosed invention, a semiconductor device which achieves miniaturization can be provided while the defects are suppressed and favorable characteristics are maintained.

BRIEF DESCRIPTION OF DRAWINGS

In the accompanying drawings:

FIGS. 6A1, 6A2, and 6B illustrate examples of a circuit diagram of a semiconductor device;

BEST MODE FOR CARRYING OUT THE INVENTION

Figure 1A:
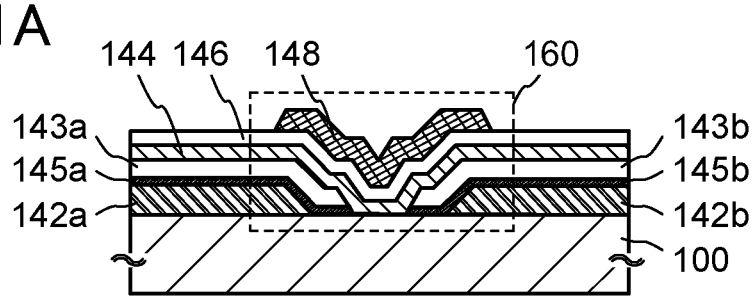
FIGS. 1A to 1D are cross-sectional views of semiconductor devices.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, an example of a structure and a manufacturing process of a semiconductor device according to an embodiment of the disclosed invention will be described with reference to FIGS. 1A to 1D, FIGS. 2A to 2F, and FIGS. 3A to 3F.

<Example of Structure of Semiconductor Device>

In FIGS. 1A to 1D, as examples of semiconductor devices, cross-sectional structures of transistors are illustrated. In FIGS. 1A to 1D, top-gate transistors are illustrated as transistors according to one embodiment of the disclosed invention.

A transistor 160 illustrated in FIG. 1A includes, over a substrate 100, a source electrode in which a first conductive layer 142a and a second conductive layer 145a are stacked in this order; a drain electrode in which a first conductive layer 142b and a second conductive layer 145b are stacked in this order; an insulating layer 143a provided over the source electrode; an insulating layer 143b provided over the drain electrode; an oxide semiconductor layer 144 provided over the insulating layers 143a and 143b; a gate insulating layer 146 provided over the oxide semiconductor layer 144; and a gate electrode 148 provided over the gate insulating layer 146.

In the transistor 160 illustrated in FIG. 1A, the second conductive layer 145a has a region which extends in the channel length direction (a flowing direction of carriers) from an end portion of the first conductive layer 142a, and the second conductive layer 145a and at least a channel formation region of the oxide semiconductor layer 144 are in contact with each other. Further, the second conductive layer 145b has a region which extends in the channel length direction from an end portion of the first conductive layer 142b, and the second conductive layer 145b and at least the channel formation region of the oxide semiconductor layer 144 are in contact with each other.

More specifically, the second conductive layer 145a has the region which extends in the channel length direction (the flowing direction of carriers) from the end portion of the first conductive layer 142a toward the drain electrode. Further, the second conductive layer 145b has the region which extends in the channel length direction from the end portion of the first conductive layer 142b toward the source electrode.

Figure 1B:
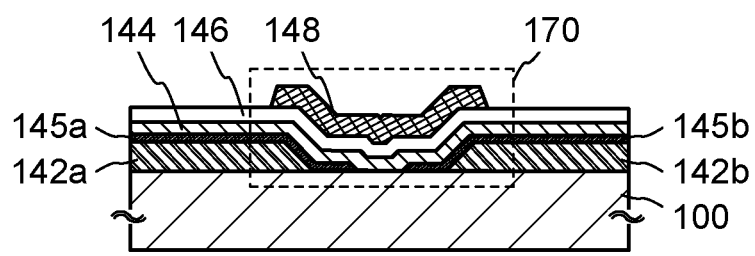

One different point of the transistor 170 illustrated in FIG. 1B from the transistor 160 illustrated in FIG. 1A is the existence of the insulating layers 143a and 143b. In the transistor 170 illustrated in FIG. 1B, the oxide semiconductor layer 144 is provided so as to be in contact with top surfaces and end portions of the second conductive layers 145a and 145b.

Also in the transistor 170 illustrated in FIG. 1B, as in the transistor 160, the second conductive layer 145a has a region which extends in the channel length direction from the end portion of the first conductive layer 142a, and the second conductive layer 145b has a region which extends in the channel length direction from the end portion of the first conductive layer 142b.

Figure 1C:
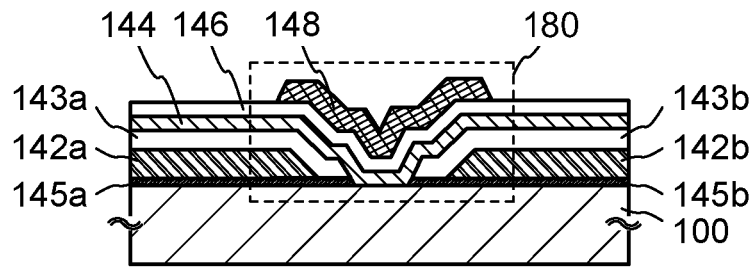

One different point of the transistor 180 illustrated in FIG. 1C from the transistor 160 illustrated in FIG. 1A is the stacking order of the first conductive layer 142a and the second conductive layer 145a and the stacking order of the first conductive layer 142b and the second conductive layer 145b. The transistor 180 illustrated in FIG. 1C has a source electrode in which the second conductive layer 145a and the first conductive layer 142a are stacked in this order and a drain electrode in which the second conductive layer 145b and the first conductive layer 142b are stacked in this order.

Further, in the transistor 180 illustrated in FIG. 1C, the second conductive layer 145a has a region which extends in the channel length direction from the end portion of the first conductive layer 142a, and the second conductive layer 145b has a region which extends in the channel length direction from the end portion of the first conductive layer 142b. Thus, the insulating layer 143a is provided so as to be in contact with the first conductive layer 142a and the region in the second conductive layer 145a, which extends in the channel length direction from the end portion of the first conductive layer 142a. Furthermore, the insulating layer 143b is provided so as to be in contact with the first conductive layer 142b and the region in the second conductive layer 145b, which extends in the channel length direction from the end portion of the first conductive layer 142b.

Figure 1D:
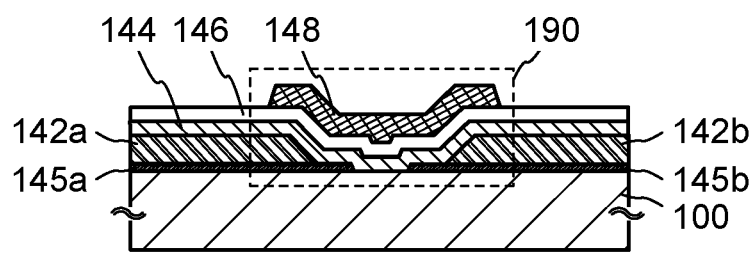

One different point of the transistor 190 illustrated in FIG. 1D from the transistor 180 illustrated in FIG. 1C is the existence of the insulating layers 143a and 143b. In the transistor 190 illustrated in FIG. 1D, the oxide semiconductor layer 144 is provided so as to be in contact with the first conductive layers 142a and 142b, the region in the second conductive layer 145a, which extends in the channel length direction from the end portion of the first conductive layer 142a, and the region in the second conductive layer 145b, which extends in the channel length direction from the end portion of the first conductive layer 142b.

In the transistor 190 illustrated in FIG. 1D, the second conductive layer 145a has the region which extends in the channel length direction from the end portion of the first conductive layer 142a, and the second conductive layer 145a and at least the channel formation region of the oxide semiconductor layer 144 are in contact with each other. Furthermore the second conductive layer 145b has the region which extends in the channel length direction from the end portion of the first conductive layer 142b, and the second conductive layer 145b and at least the channel formation region of the oxide semiconductor layer 144 are in contact with each other.

<Example of Manufacturing Process of Transistor>

An example of a manufacturing process of a transistor illustrated in FIGS. 1A to 1D will be described below with reference to FIGS. 2A to 2F and FIGS. 3A to 3F.

<Manufacturing Process of Transistor 160 and Transistor 170>

First, with reference to FIGS. 2A to 2F, an example of a manufacturing process of the transistor 160 illustrated in FIG. 1A will be described. Note that the manufacturing process of the transistor 160 can be referred to for the transistor 170 illustrated in FIG. 1B except that the insulating layers 143a and 143b are not provided; thus detailed description is omitted.

Figure 2A:
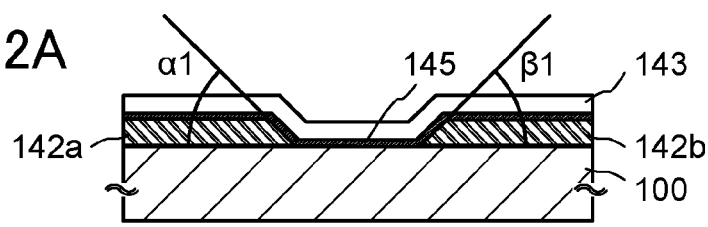
FIGS. 2A to 2F are cross-sectional views illustrating a manufacturing process of a semiconductor device.

First, a first conductive film is formed over the substrate 100 having an insulating surface, and then etching is selectively performed on the first conductive film, so that the first conductive layers 142a and 142b are formed (see FIG. 2A). The first conductive film has a thickness of, for example, 50 nm to 500 nm.

Note that there is no particular limitation on a substrate that can be used as the substrate 100 as long as it has at least heat resistance to withstand later heat treatment. For example, a substrate such as a glass substrate, a ceramic substrate, a quartz substrate, a sapphire substrate, or the like can be used. As long as the substrate 100 has an insulating surface, a single crystal semiconductor substrate or a polycrystalline semiconductor substrate of silicon, carbon silicon, or the like; a compound semiconductor substrate of silicon germanium or the like; an SOI substrate; or the like can be used as the substrate 100, and a semiconductor element can be provided over the substrate. In addition, a base film may be provided over the substrate 100.

The first conductive film can be formed by a PVD method such as a sputtering method or a CVD method such as a plasma CVD method. As a material of the first conductive layer, an element selected from aluminum, chromium, copper, tantalum, titanium, molybdenum, and tungsten, a nitride thereof, an alloy containing any of the above elements as its component, or the like can be used. Any of manganese, magnesium, zirconium, and beryllium, or a material including any of these in combination may be used. Further, aluminum combined with an element selected from titanium, tantalum, tungsten, molybdenum, chromium, neodymium, and scandium, or a material including any of these in combination may be used The first conductive layer may have either a single-layer structure or a staked structure of two or more layers. For example, the first conductive film may have a single-layer structure of a titanium layer, a single-layer structure of an aluminum film including silicon, a two-layer structure in which a titanium film is stacked over an aluminum film, or a three-layer structure in which a titanium film, an aluminum film, and a titanium film are stacked in this order. Note that in the case where the first conductive layer has a single-layer structure, there is an advantage that the first conductive layer can be easily processed into the source and drain electrode each having a tapered shape.

The first conductive film may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The first conductive film is preferably etched so that end portions of the first conductive layers 142a and 142b are tapered. Here, a taper angle $\alpha 1$ is an angle of a side surface of an end portion of the first conductive layer 142a with respect to a substrate surface, and a taper angle $\beta 1$ is an angle of a side surface of an end portion of the first conductive layer 142b with respect to the substrate surface. For example, each of the taper angle $\alpha 1$ and the taper angle $\beta 1$ is preferably greater than or equal to 30° and less than or equal to 60° (see FIG. 2A).

Next, the second conductive film 145 is formed so as to cover the first conductive layers 142a and 142b and the substrate 100. The film thickness of the second conductive film 145 is from 3 nm to 30 nm, preferably, 5 nm to 15 nm.

The second conductive film 145 can be formed using a material and a method similar to those of the first conductive film. As a material of the second conductive film, an element selected from aluminum, chromium, copper, tantalum, titanium, molybdenum, and tungsten, a nitride thereof, an alloy containing any of the above elements as its component, or the like can be used. Any of manganese, magnesium, zirconium, and beryllium, or a material including any of these in combination may be used. Alternatively, aluminum combined with an element selected from titanium, tantalum, tungsten, molybdenum, chromium, neodymium, and scandium, or a material including any of these in combination may be used. Further alternatively, a conductive metal oxide such as indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials containing silicon or silicon oxide may be used.

As the material for the second conductive film 145, a material having higher resistance than the first conductive layers 142a and 142b is preferably used. This is because in the source electrode and the drain electrode of the transistor 160 to be manufactured, regions in contact with the channel formation region of the oxide semiconductor layer become higher resistance than other regions, whereby an electric field between the source electrode and the drain electrode can be relieved, and a short-channel effect can be controlled. As a conductive material used for the second conductive film 145, for example, a metal nitride such as titanium nitride, tungsten nitride, tantalum nitride, or molybdenum nitride can be preferably used. The second conductive film 145 serves one part of the source electrode or the drain electrode and is in contact with the oxide semiconductor layer; thus, a material which does not cause a chemical reaction by contact with the oxide semiconductor layer is preferably used. The above mentioned metal nitride is preferable in this regard.

Then, the insulating film 143 is formed with a thickness of 50 nm to 300 nm, preferably 100 nm to 200 nm over the second conductive film 145 (see FIG. 2A). In this embodiment, as the insulating film 143, a silicon oxide film is formed. As illustrated in the transistor 170 of FIG. 1B, the insulating film 143 is not necessarily formed. However, in the case where the insulating film 143 is provided, contact regions (contact areas and the like) between each of the source electrode and the drain electrode to be formed later and the oxide semiconductor layer can be controlled easily. That is, the resistance of the source electrode or the drain electrode can be easily controlled, and the short-channel effect can be effectively controlled. Furthermore, by providing the insulating film 143, parasitic capacitance between the gate electrode to be formed later and each of the source electrode and the drain electrode can be reduced.

Figure 2B:
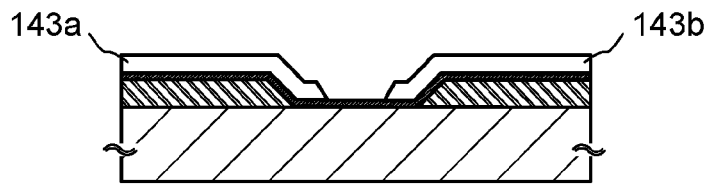

Next, a mask is formed over the insulating film 143, and the insulating film 143 is etched using the mask, whereby the insulating layers 143a and 143b are formed (see FIG. 2B). For the etching of the insulating film 143, either wet etching or dry etching can be used. Alternatively, wet etching and dry etching may be used in combination. The etching conditions (e.g., an etching gas or an etchant, etching time, and temperature) are set as appropriate depending on the material so that the insulating film can be etched into a desired shape. However, it is preferable to use dry etching for microfabrication of a channel length (L) of the transistor. As an etching gas used for dry etching, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas for dry etching.

Figure 2C:
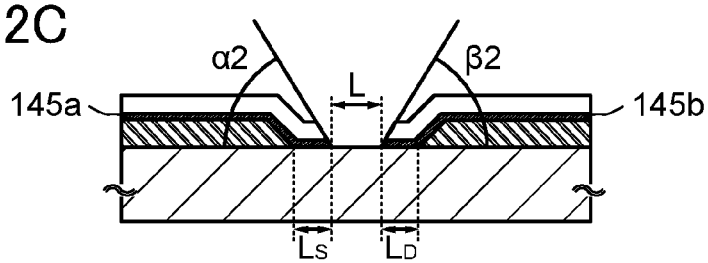

Then, by using the mask used for etching of the insulating film 143, the second conductive film 145 is etched, whereby the second conductive layers 145a and 145b are formed (see FIG. 2C). The mask is removed before the second conductive film 145 is etched, and the second conductive film 145 may be etched using the insulating layers 143a and 143b as masks. Further, as illustrated in the transistor 170 of FIG. 1B, in the case where the insulating layer is not provided, a mask may be directly formed on the second conductive film 145 and the second conductive film 145 may be etched. The second conductive film 145 is preferably etched so that end portions of the second conductive layers 145a and 145b are tapered. In the case where the insulating layer 143 is provided, etching is preferably performed so that end portions of the insulating layers 143a and 143b are also tapered. Here, a taper angle α2 is an angle of a side surface of an end portion of the second conductive layer 145a and the insulating film 143a with respect to the substrate surface, and a taper angle β2 is an angle of a side surface of an end portion of the second conductive layer 145b and the insulating layer 143b with respect to the substrate surface. For example, each of the taper angle α2 and the taper angle β2 is preferably greater than or equal to 30° and less than or equal to 60°.

For the etching of the second conductive film 145, either wet etching or dry etching can be used. Alternatively, wet etching and dry etching may be used in combination. The etching conditions (e.g., an etching gas or an etchant, etching time, and temperature) are set as appropriate depending on the material so that the second conductive film 145 can be etched into a desired shape. However, it is preferable to use dry etching for microfabrication of a channel length (L) of the transistor. As an etching gas used for etching the second conductive film 145, for example, chlorine ($Cl_2$), boron trichloride ($BCl_3$), silicon tetrachloride ($SiCl_4$), carbon tetrafluoride ($CF_4$), sulfur hexafluoride ($SF_6$), nitrogen trifluoride ($NF_3$), or the like, or a mixed gas selected from two or more of the above-mentioned gases may be used. Further, a rare gas (helium (He), or Argon (Ar)), oxygen, or the like may be added to the etching gas for dry etching. Furthermore, the second conductive film 145 can be etched successively using the same gas used for etching of the insulating film 143.

With this etching process, the source electrode in which the first conductive layer 142a and the second conductive layer 145a are stacked and the drain electrode in which the first conductive layer 142b and the second conductive layer 145b are stacked are formed. The mask used for the etching is adjusted as appropriate, whereby the second conductive layer 145a having the region which extends in the channel length direction from the end portion of the first conductive layer 142a and the second conductive layer 145b having the region which extends in the channel length direction from the end portion of the first conductive layer 142b can be formed.

Note that the channel length (L) of the transistor 160 is determined by the distance between the lower end portion of the second conductive layer 145a and the lower end portion of the second conductive layer 145b. The channel length (L) differs depending on the application of the transistor 160; which can be, for example, 10 nm to 1000 nm, preferably, 20 nm to 400 nm.

Note that in the case where a transistor with a channel length (L) of less than 25 nm is formed, for light exposure for forming a mask used for etching the insulating film 143 and the second conductive film 145, it is preferable to use extreme ultraviolet whose wavelength is as short as several nanometers to several tens of nanometers. In the light exposure by extreme ultraviolet light, the resolution is high and the focus depth is large. For these reasons, the channel length (L) of the transistor formed later can be sufficiently reduced, and the circuit can operate at higher speed. Moreover, power consumption of the semiconductor device can be reduced by miniaturization.

In the second conductive layer, the region which extends in the channel length direction from the end portion of the first conductive layer has an effect of improving coverage in the later step of forming the oxide semiconductor layer and the gate insulating layer. In the second conductive layer 145a, the length ($L_S$) in the channel length direction in the region which extends in the channel length direction from the end portion of the first conductive layer 142a and the length ($L_D$) in the channel length direction in the region which extends in the channel length direction from the end portion of the first conductive layer 142b are not always the same. However, in the case where a plurality of transistors 160 is provided over one substrate, the total length of $L_S$ and $L_D$ is almost constant.

Figure 2D:
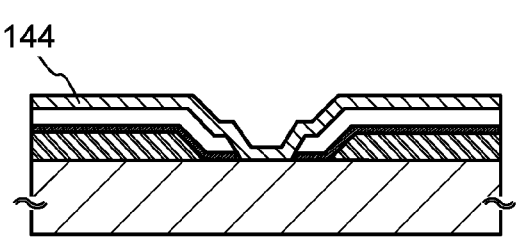

Next, the oxide semiconductor layer 144 is formed over the insulating layers 143a and 143b and the substrate 100 with a sputtering method (see FIG. 2D). The oxide semiconductor layer 144 has a thickness of, for example, 3 nm to 30 nm, preferably, 5 nm to 15 nm. The formed oxide semiconductor layer 144 is in contact with the second conductive layers 145a and 145b at least in its channel formation region.

Here, the second conductive layers 145a and 145b have regions which extend in the channel length direction from end portions of the first conductive layers 142a and 142b, respectively; therefore, steps on the end portions of the source electrode and the drain electrode can be made gradual. Thus, it is possible to improve the coverage of the oxide semiconductor layer 144 and to prevent breaking of the film.

Note that the source electrode and the drain electrode of the transistor 160 to be manufactured is in contact with the oxide semiconductor layer 144 only at end portions of the second conductive layers 145a and 145b, respectively. Accordingly, the contact area can be drastically reduced compared to the case where the top surface of the source electrode and the drain electrode of the transistor 160 is also in contact with the oxide semiconductor layer 144. By reducing the contact area of the source electrode and the drain electrode and the oxide semiconductor layer 144 in such a manner, contact resistance at a contact interface can be increased and an electric field between the source electrode and the drain electrode can be relieved. Note that a technical idea of the disclosed invention is to form a high-resistance region in the source electrode and the drain electrode. Thus, it is not necessary that the source electrode and the drain electrode be exactly in contact with the oxide semiconductor layer 144 only at end portions of the second conductive layers 145a and 145b. For example, part of the top surfaces of the second conductive layers 145a and 145b may be in contact with the oxide semiconductor layer 144.

As the oxide semiconductor layer 144, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor which are single-component metal oxides.

In particular, an In—Ga—Zn—O-based oxide semiconductor material has sufficiently high resistance when there is no electric field and thus off current can be sufficiently reduced. In addition, having a high field-effect mobility, the In—Ga—Zn—O-based oxide semiconductor material is preferable as a semiconductor material.

As a typical example of the In—Ga—Zn—O-based oxide semiconductor material, one represented by $InGaO_3(ZnO)_m$ (m>0 and m is not a natural number) is given. Using M instead of Ga, there is an oxide semiconductor material expressed by $InMO_3(ZnO)_m$ (m>0 and m is not a natural number). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures of the oxide semiconductor material and are only examples.

As a target for forming the oxide semiconductor layer 144 with a sputtering method, a target having a composition ratio of In:Ga:Zn=1:x:y (x is 0 or more and y is more than or equal to 0.5 and less than or equal to 5) is preferably used. For example, a metal oxide target having a composition ratio of $In_2O_3:Ga_2O_3:ZnO=1:1:2$ [molar ratio], or the like can be used. Alternatively, a metal oxide target having a composition ratio of $In_2O_3:Ga_2O_3:ZnO=1:1:1$ [molar ratio], a metal oxide target having a composition ratio of $In_2O_3:Ga_2O_3:ZnO=1:1:4$ [molar ratio], or a metal oxide target having a composition ratio of $In_2O_3:Ga_2O_3:ZnO=1:0:2$ [molar ratio] can be used.

In this embodiment, the oxide semiconductor layer 144 having an amorphous structure is formed by a sputtering method using an In—Ga—Zn—O-based metal oxide target.

The relative density of the metal oxide in the metal oxide target is greater than or equal to 80%, preferably greater than or equal to 95%, and more preferably greater than or equal to 99.9%. With the use of the metal oxide target with high relative density, the oxide semiconductor layer 144 having a dense structure can be formed.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or a hydride is removed so that the concentration is 1 ppm or lower (preferably 10 ppb or lower).

In forming the oxide semiconductor layer 144, for example, an object (here, a structure including the substrate 100) is held in a treatment chamber kept under reduced pressure and the object is heated to a temperature higher than or equal to 100° C. and lower than 550° C., preferably higher than or equal to 200° C. and lower than or equal to 400° C. Alternatively, the temperature of the object in forming the oxide semiconductor layer 144 may be room temperature. While moisture remaining in the treatment chamber is removed, a sputtering gas from which hydrogen, moisture and the like are removed is introduced, and the oxide semiconductor layer 144 is formed with the use of the target. The oxide semiconductor layer 144 is formed while the object is heated, so that impurities contained in the oxide semiconductor layer 144 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By evacuation with the cryopump or the like, hydrogen, water, and the like can be removed from the treatment chamber, whereby the impurity concentration of the oxide semiconductor layer 144 can be reduced.

The oxide semiconductor layer 144 can be formed under the following conditions, for example: the distance between the object and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. A pulse direct current (DC) power supply is preferable because powder substances (also referred to as particles or dust) generated in the film formation can be reduced and the film thickness can be made uniform. The thickness of the oxide semiconductor layer 144 is 3 nm to 30 nm, preferably, 5 nm to 15 nm Using the oxide semiconductor layer 144 with such a thickness can suppress the short-channel effect due to miniaturization. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer 144 is formed by a sputtering method, a material attached to a surface on which the oxide semiconductor layer 144 is formed (e.g., a surface of the insulating layers 143a and 143b) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated near the object. Note that a nitrogen atmosphere, a helium atmosphere, an oxygen atmosphere, or the like may be used instead of an argon atmosphere.

After that, heat treatment (first heat treatment) is preferably performed on the oxide semiconductor layer 144. Excess hydrogen (including water and a hydroxyl group) contained in the oxide semiconductor layer 144 can be removed by the first heat treatment; thus, the structure of the oxide semiconductor layer can be improved and a defect level in an energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, an object is introduced into an electric furnace in which a resistance heating element or the like is used, and heated in a nitrogen atmosphere at 450° C. for an hour. The oxide semiconductor layer 144 is not exposed to the air during the heat treatment so that entry of water and hydrogen can be prevented.

The heat treatment apparatus is not limited to the electric furnace and may be an apparatus for heating an object by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. An object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be changed to a gas containing oxygen during the process. This is because a defect level in an energy gap caused by oxygen deficiency can be reduced by performing the first heat treatment in the atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, the i-type (intrinsic) or substantially i-type oxide semiconductor layer 144 in which impurities are reduced by the first heat treatment is formed, which enables a transistor having extremely excellent characteristics to be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be performed once or plural times.

Figure 2E:
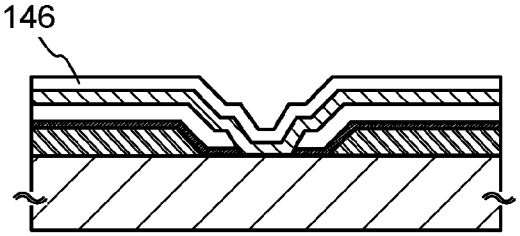

Next, the gate insulating layer 146 which is in contact with the oxide semiconductor layer 144 is formed (see FIG. 2E). Here, the second conductive layers 145a and 145b have regions which extend in the channel length direction from end portions of the first conductive layers 142a and 142b, respectively; therefore, steps on the end portions of the source electrode and the drain electrode can be made gradual. Thus, it is possible to improve the coverage of the gate insulating layer 146 and to prevent breaking of the film.

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like. The gate insulating layer 146 may have a single-layer structure or a stacked structure. There is no particular limitation on the thickness; however, in the case where the semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

As described above, when the gate insulating layer 146 is made thin, there is a problem of gate leakage due to a tunneling effect or the like. In order to solve the problem of gate leakage, a high dielectric constant (high-k) material such as hafnium oxide, tantalum oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)) is preferably used for the gate insulating layer 146. By using the high-k material for the gate insulating layer 146, electrical characteristics can be ensured and the thickness can be increased to prevent gate leakage. Note that a stacked structure of a film containing the high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electrical characteristics of transistors. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that although the second heat treatment is performed in this embodiment after the gate insulating layer 146 is formed, the timing of the second heat treatment is not limited thereto. For example, the second heat treatment may be performed after the gate electrode is formed. Alternatively, the second heat treatment may be performed following the first heat treatment, the first heat treatment may serve also as the second heat treatment, or the second heat treatment may serve also as the first heat treatment.

As described above, at least one of the first heat treatment and the second heat treatment is applied, whereby the oxide semiconductor layer 144 can be highly purified as to minimize the amount of impurities that are not main components of the oxide semiconductor. The concentration of hydrogen in the oxide semiconductor layer 144 can be $5 \times 10^{19}$ atoms/cm$^3$ or less, preferably $5 \times 10^{18}$ atoms/cm$^3$ or less, more preferably $5 \times 10^{17}$ atoms/cm$^3$ or less. Accordingly, the off-state current is sufficiently small. For example, the off current (per unit channel width (1 μm), here) of the transistor 160 at room temperature is 100 zA/μm (1 zA (zeptoampere) is $1 \times 10^{-21}$ A) or less, preferably 10 zA/μm or less.

Figure 2F:
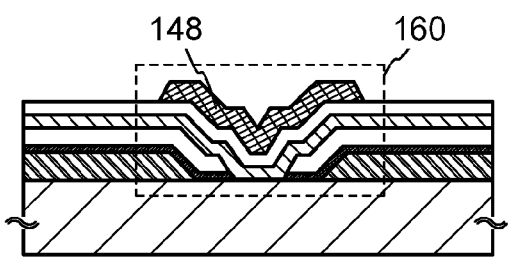

Next, the gate electrode 148 is formed over the gate insulating layer 146 in a region overlapping with the channel formation region of the oxide semiconductor layer 144 (see FIG. 2F). The gate electrode 148 can be formed in such a manner that a conductive film is formed over the gate insulating layer 146 and then etched selectively. The conductive film to be the gate electrode 148 can be formed by a PVD method typified by a sputtering method or a CVD method such as a plasma CVD method. The details are similar to those of the source electrode, the drain electrode or the like; thus, the description thereof can be referred to. However, if the work function of the material of the gate electrode 148 is approximately the same as or smaller than the electron affinity of the oxide semiconductor layer 144, the threshold voltage sometimes shifts in the negative direction when a transistor is miniaturized. Thus, a material having a larger work function than the electron affinity of the oxide semiconductor layer 144 is preferably used. As such a material, for example, tungsten, platinum, gold, silicon which imparts p-type conductivity, or the like can be given.

Through the above steps, the transistor 160 including the oxide semiconductor layer 144 is completed.

<Manufacturing Process of Transistor 180 or Transistor 190>

Next, an example of a manufacturing process of the transistor 180 illustrated in FIG. 1C will be described with reference to FIGS. 3A to 3F. Note that the manufacturing process of the transistor 180 can be referred to for the transistor 190 illustrated in FIG. 1D except that the insulating layers 143a and 143b are not provided; thus detailed description is omitted.

The second conductive film 145 is formed over the substrate 100. The second conductive film 145 has a thickness of, for example, 3 nm to 30 nm, preferably, 5 nm to 15 nm. Then, the first conductive film is formed over the second conductive film 145 and then etched selectively, whereby the first conductive layers 142a and 142b are formed. After that, the insulating film 143 is formed over the first conductive layers 142a and 142b and the second conductive film 145 (see FIG. 3A).

Note that in the case where the first conductive film is formed over the second conductive film, materials which can obtain etching selectivity is selected for the first conductive film and the second conductive film. Further, a material having higher resistance than the first conductive film is preferably used for the second conductive film. In this embodiment, a titanium nitride film is formed as the second conductive film 145; a tungsten film or a molybdenum film is formed as the first conductive film; and the first conductive film is etched using a mixed gas of carbon tetrafluoride ($CF_4$), chlorine ($Cl_2$), and oxygen ($O_2$), a mixed gas of carbon tetrafluoride ($CF_4$), and oxygen ($O_2$), a mixed gas of sulfur hexafluoride ($SF_6$), chlorine ($Cl_2$), and oxygen ($O_2$), or a mixed gas of sulfur hexafluoride ($SF_6$) and oxygen ($O_2$), whereby the first conductive layers 142a and 142b are formed.

As illustrated in the transistor 190 of FIG. 1D, the insulating film 143 is not necessarily formed. However, by providing the insulating film 143, parasitic capacitance between the gate electrode to be formed later and each of the source electrode and the drain electrode can be reduced.

Figure 3A:
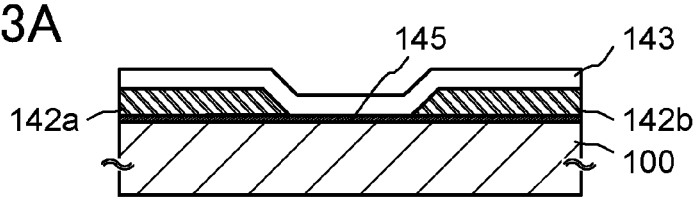
FIGS. 3A to 3F are cross-sectional views illustrating a manufacturing process of a semiconductor device.
Figure 3B:
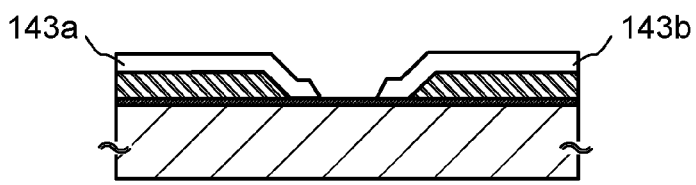

Next, in a manner similar to the step shown in FIG. 2B, a mask is formed over the insulating film 143, and the insulating film 143 is etched using the mask, whereby the insulating layers 143a and 143b are formed (see FIG. 3B).

Figure 3C:
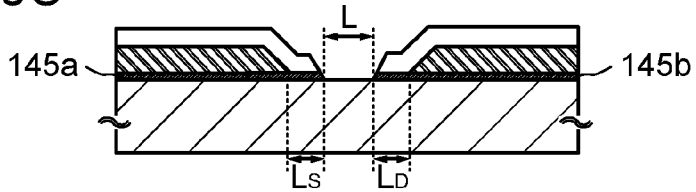

Next, in a manner similar to the step shown in FIG. 2C, the second conductive film 145 is etched using the mask used for etching of the insulating layers 143a and 143b, whereby the second conductive layers 145a and 145b are formed (see FIG. 3C). Note that the mask may be removed before the second conductive film 145 is etched, and then the second conductive film 145 may be etched using the insulating layers 143a and 143b as masks. As an etching gas used for etching the second conductive film 145, for example, chlorine ($Cl_2$), boron trichloride ($BCl_3$), silicon tetrachloride ($SiCl_4$), carbon tetrafluoride ($CF_4$), sulfur hexafluoride ($SF_6$), nitrogen trifluoride ($NF_3$), or the like, or a mixed gas selected from two or more of the above-mentioned gases can be used. Further, a rare gas (helium (He), or Argon (Ar)) may be added to the etching gas. Furthermore, as illustrated in the transistor 190 of FIG. 1D, in the case where an insulating layer is not provided, a mask is directly formed on the second conductive film 145, and the second conductive film is etched.

Figure 3D:
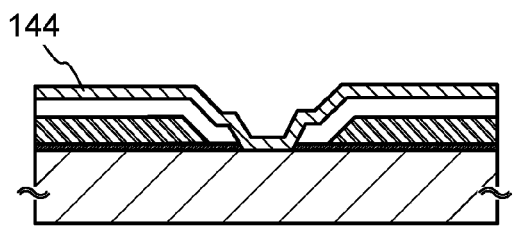

Next, in a manner similar to the step illustrated in FIG. 2D, the oxide semiconductor layer 144 is formed over the insulating layers 143a and 143b and the substrate 100 (see FIG. 3D). The formed oxide semiconductor layer 144 is in contact with the second conductive layers 145a and 145b in its channel formation region. Further, the oxide semiconductor layer 144 is desirably subjected to heat treatment (first heat treatment).

Figure 3E:
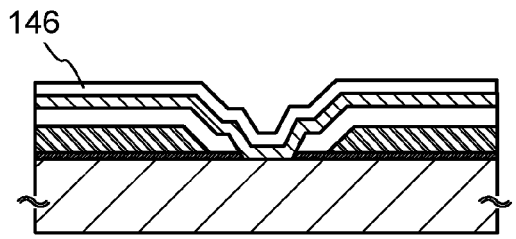

Then, in a manner similar to the step illustrated in FIG. 2E, the gate insulating layer 146 is formed (see FIG. 3E). After forming the gate insulating layer 146, heat treatment (second heat treatment) is desirably performed.

Figure 3F:
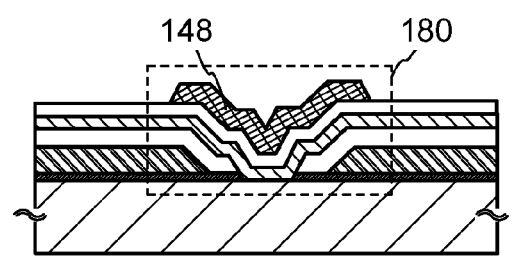

Then, in a manner similar to the step illustrated in FIG. 2F, the gate electrode 148 is formed over the gate insulating layer 146 in a region overlapping with the channel formation region of the oxide semiconductor layer 144 (see FIG. 3F).

Through the above steps, the transistor 180 including the oxide semiconductor layer 144 is completed.

The transistors 160, 170, 180, and 190 illustrated in this embodiment each include the source electrode and the drain electrode in which the first electrode and the second electrode are stacked. In each of the transistors, the second conductive layers 145a and 145b have regions which extend in the channel length direction from the end portions of the first conductive layers 142a and 142b. Accordingly, steps on end portions of the source electrode and the drain electrode can be made gradual. Thus, it is possible to improve the coverage of the oxide semiconductor layer 144 and the gate insulating layer 146 and to prevent occurrence of poor connections.

In each of the transistors 160, 170, 180, and 190 illustrated in this embodiment, in the source electrode or the drain electrode, the vicinity of the region in contact with the channel formation region can be a high-resistance region, whereby an electric field between the source electrode and the drain electrode can be relieved. Thus, a short-channel effect in accordance with a reduction in a transistor size can be controlled.

As described above, according to an embodiment of the disclosed invention, a problem due to miniaturization can be resolved. As a result, the size of the transistor can be sufficiently reduced. By sufficiently reducing the size of the transistor, an area of a semiconductor device including the transistor is decreased, and the number of semiconductor devices obtained from one substrate is increased. Accordingly, manufacturing costs of the semiconductor device can be reduced. Further, since the semiconductor device is downsized, the semiconductor device which is substantially the same in size with increased function can be realized. Furthermore, effects of high-speed operation, low power consumption, and the like of a transistor can be obtained in accordance with a reduction in channel length. Thus, miniaturization of a transistor including an oxide semiconductor can be achieved according to an embodiment of the disclosed invention, and various effects accompanied with the miniaturization can be obtained.

The structures, methods, and the like described in this embodiment can be combined as appropriate with any of the structures, methods, and the like described in the other embodiments.

(Embodiment 2)

In this embodiment, a structure and a manufacturing process of a semiconductor device according to one embodiment of the disclosed invention, which are different from those of Embodiment 1, will be described with reference to FIG. 4 and FIGS. 5A to 5F.

<Example of Structure of Semiconductor Device>

Figure 4:
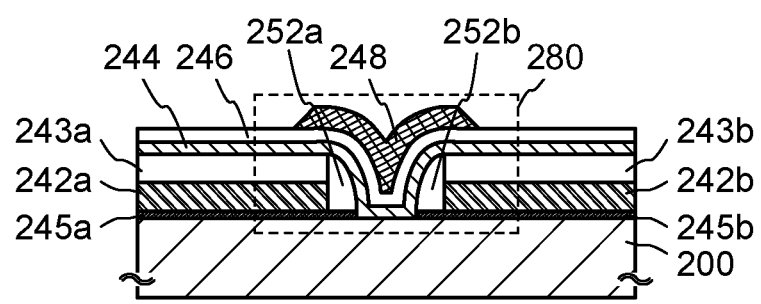
FIG. 4 is a cross-sectional view of a semiconductor device.

A transistor 280 illustrated in FIG. 4 is an example of a structure of a semiconductor device. The order of stacking of the transistor 280 corresponds to that of the transistor 180 illustrated in FIG. 1C. The difference between the transistor 280 and the transistor 180 is that a sidewall insulating layer 252a is provided over the second conductive layer 245a in a region which extends in a channel length direction from an end portion of the first conductive layer 242a and a sidewall insulating layer 252b is provided over the second conductive layer 245b in a region which extends in a channel length direction from an end portion of the first conductive layer 242b.

The transistor 280 illustrated in FIG. 4 includes, over a substrate 200, a source electrode in which the second conductive layer 245a and the first conductive layer 242a are stacked in this order; a drain electrode in which the second conductive layer 245b and the first conductive layer 242b are stacked in this order; an insulating layer 243a provided over the source electrode; an insulating layer 243b provided over the drain electrode; an oxide semiconductor layer 244 provided over the insulating layers 243a and 243b; a gate insulating layer 246 provided over the oxide semiconductor layer 244; and a gate electrode 248 provided over the gate insulating layer 246.

In the transistor 280 illustrated in FIG. 4, the second conductive layer 245a has the region which extends in the channel length direction from the end portion of the first conductive layer 242a, and the second conductive layer 245a and at least a channel formation region of the oxide semiconductor layer 244 are in contact with each other. Further, the second conductive layer 245b has the region which extends in the channel length direction from the end portion of the first conductive layer 242b, and the second conductive layer 245b and at least the channel formation region of the oxide semiconductor layer 244 are in contact with each other.

More specifically, the second conductive layer 245a has the region which extends in the channel length direction (the flowing direction of carriers) from the end portion of the first conductive layer 242a toward the drain electrode. Further, the second conductive layer 245b has the region which extends in the channel length direction from the end portion of the first conductive layer 242b toward the source electrode.

Further, the transistor 280 illustrated in FIG. 4 has the sidewall insulating layer 252a over the second conductive layer 245a in the region which extends in the channel length direction from the end portion of the first conductive layer 242a and the sidewall insulating layer 252b over the second conductive layer 245b in the region which extends in the channel length direction from the end portion of the first conductive layer 242b. The sidewall insulating layer 252a is provided so as to be in contact with the oxide semiconductor layer 244 (at least the channel formation region thereof), the second conductive layer 245a, the first conductive layer 242a, and the insulating layer 243a. Further, in the sidewall insulating layer 252a, part of a region in contact with the oxide semiconductor layer 244 has a curved shape. The sidewall insulating layer 252b is provided so as to be in contact with the oxide semiconductor layer 244 (at least the channel formation region thereof), the second conductive layer 245b, the first conductive layer 242b, and the insulating layer 243b. Further, in the sidewall insulating layer 252b, part of a region in contact with the oxide semiconductor layer 244 has a curved shape.

<Example of Manufacturing Process of Transistor 280>

Next, an example of a manufacturing process of the transistor 280 will be described with reference to FIG. 5A to 5F.

First, the second conductive film 245 is formed over the substrate 200. Next, the first conductive film 242 is formed over the second conductive film 245, and the insulating film 243 is formed over the first conductive film 242 (see FIG. 5A).

Here, a material similar to that of the substrate 100 described in Embodiment 1 can be used for the substrate 200. Further, the second conductive film 245 can be formed using a material and a method similar to those of the second conductive film 145 described in Embodiment 1. Furthermore, the first conductive film 242 can be formed using a material and a method similar to those of the first conductive film described in Embodiment 1. Embodiment 1 can be referred to for the details.

However, materials which can obtain etching selectivity are used for the first conductive film 242 and the second conductive film 245. In this embodiment, a titanium nitride film is formed as the second conductive film 245 and a tungsten film or a molybdenum film is formed as the first conductive film 242.

Next, a mask is formed over the insulating film 243, and the insulating film 243 is etched using the mask, whereby the insulating layers 243a and 243b are formed. For the etching of the insulating film 243, either wet etching or dry etching can be used. Alternatively, wet etching and dry etching may be used in combination. The etching conditions (e.g., an etching gas or an etchant, etching time, and temperature) are set as appropriate depending on the material so that the insulating film can be etched into a desired shape. However, it is preferable to use dry etching for microfabrication of a channel length (L) of the transistor. As an etching gas used for dry etching, for example, a gas containing fluorine such as, sulfur hexafluoride ($SF_6$), nitrogen trifluoride ($NF_3$), or trifluoromethane ($CHF_3$)); or a mixed gas of carbon tetrafluoride ($CF_4$) and hydrogen can be used. A rare gas (helium (He), Argon (Ar), or xenon (Xe)), carbon monoxide, carbon dioxide, or the like may be added to the etching gas for dry etching.

Figure 5A:
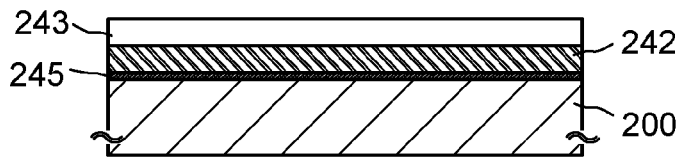
FIGS. 5A to 5F are cross-sectional views illustrating a manufacturing process of a semiconductor device.
Figure 5B:
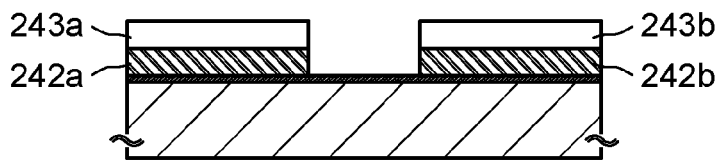

Next, the first conductive film 242 is etched using the mask used for etching of the insulating film 243, whereby the first conductive layers 242a and 242b are formed (see FIG. 5B). Note that when the first conductive film 242 is etched, a material which can obtain etching selectivity with respect to the second conductive film 245 is used. Note that the mask may be removed before etching the first conductive film 242, and the first conductive film 242 may be etched using the insulating layers 243a and 243b as masks.

In this embodiment, as an etching gas for etching the first conductive film 242, a mixed gas of carbon tetrafluoride ($CF_4$), chlorine ($Cl_2$), and oxygen ($O_2$), a mixed gas of carbon tetrafluoride ($CF_4$) and oxygen ($O_2$), a mixed gas of sulfur hexafluoride ($SF_6$) chlorine ($Cl_2$), and oxygen ($O_2$), or a mixed gas of sulfur hexafluoride ($SF_6$) and oxygen ($O_2$), is used.

By providing the insulating layers 243a and 243b, contact regions (contact areas and the like) between each of the source electrode and the drain electrode to be formed later and the oxide semiconductor layer can be controlled easily. That is, the resistance of the source electrode and the drain electrode can be easily controlled, and the short-channel effect can be effectively controlled. Furthermore, by providing the insulating layers 243a and 243b, parasitic capacitance between the gate electrode to be formed later and each of the source electrode and the drain electrode can be reduced.

Figure 5C:
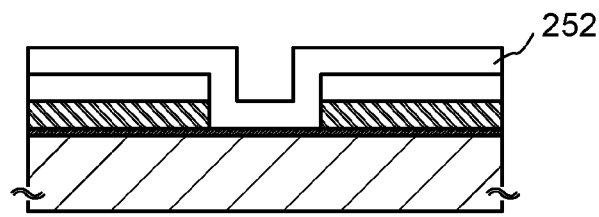

Then, an insulating film 252 is formed so as to cover the insulating layers 243a, 243b, and the exposed second conductive film 245 (see FIG. 5C). The insulating film 252 can be formed by a CVD method, or a sputtering method. The insulating film 252 preferably contains silicon oxide, silicon nitride, silicon oxynitride, aluminum oxide, or the like. The insulating film 252 may have a single-layer structure or a stacked structure.

Figure 5D:
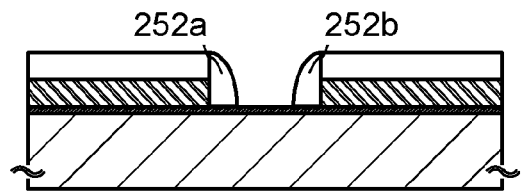

Then, the sidewall insulating layers 252a and 252b are formed over the region where the second conductive film 245 is exposed (a region between the first conductive layer 242a and the first conductive layer 242b) (see FIG. 5D). The insulating film 252 is subjected to highly anisotropic etching treatment, whereby the sidewall insulating layers 252a and 252b can be formed in a self-aligned manner. Here, as a highly anisotropic etching process, dry etching is preferable. As an example of the etching gas, a gas containing fluorine such as, trifluoromethane ($CHF_3$) can be used, or a rare gas such as helium (He) or Argon (Ar) may be added. In addition, as the dry etching, a reactive ion etching (RIE) method in which high-frequency voltage is applied to a substrate, is preferably used.

Figure 5E:
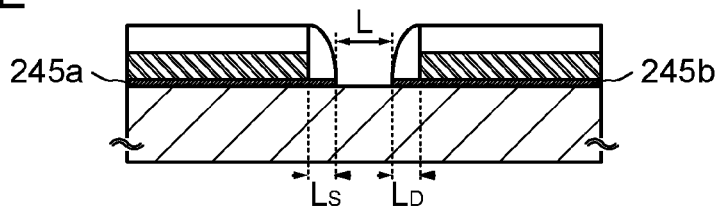
Figure 5F:
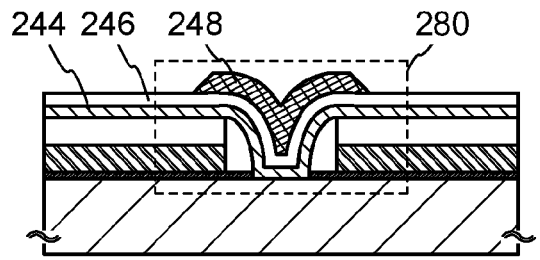

Next, the second conductive film 245 is selectively etched using the sidewall insulating layers 252a and 252b as masks (see FIG. 5E). Through this etching process, the source electrode in which the second conductive layer 245a and the first conductive layer 242a are stacked and the drain electrode in which the second conductive layer 245b and the first conductive layer 242b are stacked are formed. The etching of the second conductive film 245 can be performed in a manner similar to that described in Embodiment 1 with reference to FIG. 2C except that the sidewall insulating layers 252a and 252b are used as masks.

Note that the channel length (L) of the transistor 280 is determined by the distance between the lower end portion of the second conductive layer 245a and the lower end portion of the second conductive layer 245b. The channel length (L) depends on the application of the transistor 280; which can be, for example, 10 nm to 1000 nm, preferably, 20 nm to 400 nm.

Note that in the manufacturing process of the transistor described in this embodiment, the second conductive film 245 is etched using the sidewall insulating layer 252a or the sidewall insulating layer 252b. Therefore, in the second conductive layer 245a, the length ($L_S$) in a channel length direction in the region which extends in the channel length direction from the end portion of the first conductive layer 242a and the length in a channel length direction in the bottom face of the sidewall insulating layer 252a are almost the same. At the same time, in the second conductive layer 245b, the length ($L_D$) in a channel length direction in the region which extends in the channel length direction from the end portion of the first conductive layer 242b and the length in the channel length direction in the bottom face of the sidewall insulating layer 252b are almost the same. Since the sidewall insulating layers 252a and 252b are formed in a self-aligned manner by etching treatment on the insulating film 252, the ($L_S$) or ($L_D$) is determined in accordance with the film thickness of the insulating film 252. Thus, by controlling the thickness of the insulating film 252, the channel length (L) of the transistor 280 can be adjusted finely. For example, the channel length (L) of the transistor 280 can be adjusted more minutely than the minimum processing dimension of a light-exposure apparatus for forming a mask. Thus, the thickness of the insulating film 252 is determined in accordance with the desired channel length (L) of the transistor 280, resolution of the light-exposure apparatus used for processing of the first conductive layers 242a and 242b, and the like.

Next, the oxide semiconductor layer 244 is formed to cover the insulating layers 243a and 243b and the sidewall insulating layers 252a and 252b and to be in contact with the second conductive layers 245a and 245b, and the gate insulating layer 246 is formed over the oxide semiconductor layer 244. Then, the gate electrode 248 is formed over the gate insulating layer 246 in a region overlapping with the channel formation region of the transistor 280 (see FIG. 5F).

The oxide semiconductor layer 244 can be formed using a material and a method similar to those of the oxide semiconductor layer 144 illustrated in Embodiment 1. Further, the oxide semiconductor layer 244 is desirably subjected to heat treatment (first heat treatment). Embodiment 1 can be referred to for the details.

The gate insulating layer 246 can be formed using a material and a method similar to those of the gate insulating layer 146 illustrated in Embodiment 1. Further, the formed gate insulating layer 246 is desirably subjected to heat treatment (second heat treatment) in an inert gas atmosphere or an oxygen atmosphere. Embodiment 1 can be referred to for the details.

The gate electrode 248 can be formed in such a manner that a conductive film is formed over the gate insulating layer 246 and then etched selectively. The gate electrode 248 can be formed using a material and a method similar to those of the gate electrode 148 illustrated in Embodiment 1.

Note that the source electrode of the transistor 280 is in contact with the oxide semiconductor layer 244 at an end portion of the region which extends in the channel length direction from an end portion of the first conductive layer 242a in the second conductive layer 245a. On the other hand, the drain electrode of the transistor 280 is in contact with the oxide semiconductor layer 244 at an end portion of the region which extends in the channel length direction from an end portion of the first conductive layer 242b in the second conductive layer 245b. As described, the source electrode and the drain electrode of the transistor 280 is in contact with the oxide semiconductor layer 244 at the end portions of the second conductive layers 245a and 245b which have smaller film thickness than the first conductive layers 242a and 242b, whereby the contact area thereof can be reduced, and contact resistance at an contact interface can be increased. Accordingly, even if the channel length (L) of the transistor 280 is shortened, electric field between the source electrode and the drain electrode can be relieved, and a short-channel effect can be controlled. In addition, when the second conductive layer is formed using a higher resistance material than the first conductive layer, contact resistance can be increased effectively, which is preferable. Note that a technical idea of the disclosed invention is to form a high-resistance region in the source electrode and the drain electrode; thus, the source electrode and the drain electrode does not need to be exactly in contact with the oxide semiconductor layer only at the end portions of the second conductive layers 245a and 245b.

Accordingly, the transistor 280 including the oxide semiconductor layer 244 can be manufactured.

The channel length (L) of the transistor 280 described in this embodiment can be adjusted finely by the film thickness of the insulating film 252 for forming the sidewall insulating layers 252a and 252b. Therefore, the film thickness of the insulating film 252 is set as appropriate, the channel length (L) of the transistor 280 is shortened, and thus a semiconductor device can be easily miniaturized.

In the transistor 280 described in this embodiment, the sidewall insulating layer 252a is provided over the region which extends in the channel length direction from the end portion of the first conductive layer 242a in the second conductive layer 245a, and the sidewall insulating layer 252b is provided over the region which extends in the channel length direction from the end portion of the first conductive layer 242b in the second conductive layer 245b. Accordingly, coverage of the oxide semiconductor layer 244 and the gate insulating layer 246 are improved, and occurrence of poor connections can be prevented.

Further, the transistor 280 described in this embodiment includes the region which extends in the channel length direction from the end portion of the first conductive layer 242a in the second conductive layer 245a, and the region which extends in the channel length direction from the end portion of the first conductive layer 242b in the second conductive layer 245b, and the vicinity of the regions in contact with the channel formation region of the oxide semiconductor layer 244 is made to be high-resistance region. Therefore, an electric field between the source electrode and the drain electrode can be relieved, and a short-channel effect such as a decrease in a threshold voltage can be controlled.

As described above, according to an embodiment of the disclosed invention, a problem due to miniaturization can be resolved. As a result, the size of the transistor can be sufficiently reduced. By sufficiently reducing the size of the transistor, an area of a semiconductor device including the transistor is decreased, and the number of semiconductor devices obtained from one substrate is increased. Accordingly, manufacturing costs of the semiconductor device can be reduced. Further, since the semiconductor device is downsized, the semiconductor device which is substantially the same in size with increased function can be realized. Furthermore, effects of high-speed operation, low power consumption, and the like of a transistor can be obtained in accordance with a reduction in channel length. Thus, miniaturization of a transistor including an oxide semiconductor can be achieved according to one embodiment of the disclosed invention, and various effects accompanied with the miniaturization can be obtained.

The structures, methods, and the like described in this embodiment can be combined as appropriate with any of the structures, methods, and the like described in the other embodiments.

(Embodiment 3)

In this embodiment, application examples of a semiconductor device according to one embodiment of the disclosed invention will be described with reference to FIGS. 6A-1, 6A-2, and 6B. Here, an example of a memory device will be described. Note that in a circuit diagram, "OS" is written in order to indicate that a transistor includes an oxide semiconductor.

In the semiconductor device illustrated in FIG. 6A-1, a first wiring (a 1st line) is electrically connected to a source electrode of a transistor 300. A second wiring (a 2nd line) is electrically connected to a drain electrode of the transistor 300. Further, a third wiring (a 3rd line) is electrically connected to one of a source electrode and a drain electrode of a transistor 310, and a fourth wiring (4th Line) is electrically connected to a gate electrode of the transistor 310. A gate electrode of the transistor 300 and the other of the source electrode and the drain electrode of the transistor 310 are electrically connected to one of electrodes of a capacitor 320. A fifth wiring (a 5th line) is electrically connected to the other of the electrodes of the capacitor 320.

Here, a transistor including an oxide semiconductor described in Embodiments 1 and 2 are used for the transistor 310. A transistor including an oxide semiconductor has a characteristic of a significantly small off current. For that reason, a potential of the gate electrode of the transistor 300 can be held for an extremely long time by turning off the transistor 310. Provision of the capacitor 320 facilitates holding of charge given to the gate electrode of the transistor 300 and reading of stored data.

Note that there is no particular limitation on the transistor 300. In terms of increasing the speed of reading data, it is preferable to use, for example, a transistor with high switching rate such as a transistor formed using single crystal silicon.

Further, as illustrated in FIG. 6B, a structure in which the capacitor 320 is not provided may also be employed.

The semiconductor device in FIG. 6A-1 utilizes the advantage that the potential of the gate electrode of the transistor 300 can be held, whereby writing, holding, and reading of data can be performed as described below.

Firstly, writing and holding of data will be described. First, the potential of the fourth wiring is set to a potential at which the transistor 310 is turned on, so that the transistor 310 is turned on. Accordingly, the potential of the third wiring is supplied to the gate electrode of the transistor 300 and the capacitor 320. That is, predetermined charge is given to the gate electrode of the transistor 300 (writing). Here, one of charges for supply of two different potentials (hereinafter, a charge for supply of a low potential is referred to as a charge $Q_L$ and a charge for supply of a high potential is referred to as a charge $Q_H$) is given to the gate electrode of the transistor 300. Note that charges giving three or more different potentials may be applied to improve a storage capacitor. After that, the potential of the fourth wiring is set to a potential at which the transistor 310 is turned off, so that the transistor 310 is turned off. Thus, the charge given to the gate electrode of the transistor 300 is held (storing).

Since the off current of the transistor 310 is significantly small, the charge of the gate electrode of the transistor 300 is retained for a long time.

Secondly, reading of data will be described. By supplying an appropriate potential (read-out potential) to the fifth wiring while a predetermined potential (constant potential) is supplied to the first wiring, the potential of the second wiring varies depending on the amount of charge held in the gate electrode of the transistor 300. This is because in general, when the transistor 300 is an n-channel transistor, an apparent threshold voltage $V_{th\_H}$ in the case where $Q_H$ is given to the gate electrode of the transistor 300 is lower than an apparent threshold voltage $V_{th\_L}$ in the case where $Q_L$ is given to the gate electrode of the transistor 300. Here, an apparent threshold voltage refers to the potential of the fifth wiring, which is needed to turn on the transistor 300. Thus, the potential of the fifth wiring is set to a potential $V_0$ intermediate between $V_{th\_H}$ and $V_{th\_L}$, whereby charge given to the gate electrode of the transistor 300 can be determined. For example, in the case where $Q_H$ is given in writing, when the potential of the fifth wiring is set to $V_0$ ($>V_{th\_H}$), the transistor 300 is turned on. In the case where $Q_L$ is given in writing, even when the potential of the fifth wiring is set to $V_0$ ($<V_{th\_L}$), the transistor 300 remains in an off state. Therefore, the stored data can be read by the potential of the second wiring.

Note that in the case where memory cells are arrayed to be used, only data of desired memory cells is needed to be read. Thus, in order that data of predetermined memory cells is read and data of the other memory cells is not read, in the case where the transistors 300 are connected in parallel between the memory cells, a potential which allows the transistor 300 to be turned off regardless of a state of the gate electrode, that is, a potential lower than $V_{th\_H}$ may be applied to the fifth wiring of the memory cells whose data is not to be read. Further, in the case where transistors 300 are connected in series between the memory cells, a potential which allows the transistor 300 to be turned on regardless of a state of the gate electrode, that is, a potential higher than $V_{th\_L}$ may be applied to the fifth wiring of the memory cells whose data is not to be read.

Then, rewriting of data will be described. Rewriting of data is performed in a manner similar to that of the writing and holding of data. That is, the potential of the fourth wiring is set to a potential at which the transistor 310 is turned on, so that the transistor 310 is turned on. Accordingly, the potential of the third wiring (potential related to new data) is supplied to the gate electrode of the transistor 300 and the capacitor 320. After that, the potential of the fourth wiring is set to a potential which allows the transistor 310 to be turned off, whereby the transistor 310 is turned off. Accordingly, charge related to new data is given to the gate electrode of the transistor 300.

In the semiconductor device according to the invention disclosed herein, data can be directly rewritten by another writing of data as described above. Therefore, extracting of charge from a floating gate with the use of a high voltage needed in a flash memory or the like is not necessary and thus, reduction in operation speed, which is attributed to erasing operation, can be suppressed. In other words, high-speed operation of the semiconductor device can be realized.

The source electrode or the drain electrode of the transistor 310 is electrically connected to the gate electrode of the transistor 300, thereby having an effect similar to that of a floating gate of a floating gate transistor used for a nonvolatile memory element. Therefore, a portion in the drawing where the source electrode or the drain electrode of the transistor 310 is electrically connected to the gate electrode of the transistor 300 is called a floating gate portion FG in some cases. When the transistor 310 is off, the floating gate portion FG can be regarded as being embedded in an insulator and thus charge is held in the floating gate portion FG. The amount of off current of the transistor 310 including an oxide semiconductor is smaller than or equal to one hundred thousandth of the amount of off current of a transistor including a silicon semiconductor; thus, lost of the charge accumulated in the floating gate portion FG due to a leakage current of the transistor 310 is negligible. That is, with the transistor 310 including an oxide semiconductor, a nonvolatile memory device which can store data without being supplied with power can be realized.

For example, when the off current of the transistor 310 is 10 zA (1 zA (zeptoampere) is $1\times10^{-21}$ A) or less at room temperature and the capacitance value of the capacitor 320 is approximately 10 fF, data can be stored for $10^4$ seconds or longer. It is needless to say that the storage time depends on transistor characteristics and the capacitance value.

Further, in that case, the problem of deterioration of a gate insulating film (tunnel insulating film), which is pointed out in a conventional floating gate transistor, does not exist. That is to say, the problem of deterioration of a gate insulating film when an electron is injected into a floating gate, which has been traditionally regarded as a problem, can be neglected. This means that there is no limit on the number of times of writing in principle. Furthermore, a high voltage needed for writing or erasing in a conventional floating gate transistor is not necessary.

The components such as transistors in the semiconductor device in FIG. 6A-1 can be regarded as including a resistor and a capacitor as shown in FIG. 6A-2. That is, in FIG. 6A-2, the transistor 300 and the capacitor 320 are each regarded as including a resistor and a capacitor. R1 and C1 denote the resistance value and the capacitance value of the capacitor 320, respectively. The resistance value R1 corresponds to the resistance value which depends on an insulating layer included in the capacitor 320. R2 and C2 denote the resistance value and the capacitance value of the transistor 300, respectively. The resistance value R2 corresponds to the resistance value which depends on a gate insulating layer at the time when the transistor 300 is on. The capacitance value C2 corresponds to the capacitance value of so-called gate capacitance (capacitance formed between the gate electrode and each of the source electrode and the drain electrode and capacitance formed between the gate electrode and the channel formation region).

A charge holding period (also referred to as a data holding period) is determined mainly by off current of the transistor 310 under the conditions that gate leakage of the transistor 310 is sufficiently small and that R1≧ROS (R1 is ROS or more) and R2≧ROS (R2 is ROS or more) are satisfied, where the resistance value (also referred to as effective resistance) between the source electrode and the drain electrode in the case where the transistor 310 is off is ROS.

On the other hand, when the conditions are not met, it is difficult to sufficiently secure the holding period even if the off current of the transistor 310 is small enough. This is because a leakage current other than the off current of the transistor 310 (e.g., a leakage current generated between the source electrode and the gate electrode) is large. Thus, it can be said that the semiconductor device disclosed in this embodiment desirably satisfies the above relation.

It is desirable that C1 and C2 satisfy C1≧C2 (C1 is C2 or more). If C1 is large, variation in potential of the fifth wiring can be suppressed when the potential of the floating gate portion FG is controlled by the fifth wiring (e.g., at the time of reading).

When the above relation is satisfied, a more preferable semiconductor device can be realized. Note that R1 and R2 are controlled by the gate insulating layer of the transistor 300 and the insulating layer of the capacitor 320. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current flows in applying a high electric field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention is operated by switching of a transistor including an oxide semiconductor and does not use the above-described principle of charge injection by a tunneling current. That is, a high electrical field for charge injection is not necessary unlike a flash memory. Accordingly, it is not necessary to consider an influence of a high electric field from a control gate on an adjacent cell, which facilitates high integration.

Further, charge injection by a tunneling current is not utilized, which means that there is no causes for deterioration of a memory cell. In other words, the semiconductor device according to the disclosed invention has higher durability and reliability than a flash memory.

In addition, it is also advantageous that a high electric field is unnecessary and a large peripheral circuit (such as a booster circuit) is unnecessary as compared to a flash memory.

In the case where the dielectric constant $\in r1$ of the insulating layer included in the capacitor 320 is different from the dielectric constant $\in r2$ of the insulating layer included in a gate capacitor of the transistor 300, it is easy to satisfy $C1 \geqq C2$ (C1 is C2 or greater) while $2 \cdot S2 \geqq S1$ ($2 \cdot S2$ is S1 or more) (desirably, $S2 \geqq S1$ (S is S1 or more)) is satisfied where S1 is the area of the insulating layer included in the capacitor 320 and S2 is the area of the insulating layer included in a gate capacitor of the transistor 300. That is, it is easy to satisfy that C1 is C2 or greater while reducing S1. Specifically, for example, a film formed of a high-k material such as hafnium oxide or a stack of a film formed of a high-k material such as hafnium oxide and a film formed of an oxide semiconductor is used for the insulating layer included in the capacitor 320 so that $\in r1$ can be set to 10 or more, preferably 15 or more, and silicon oxide is used for the insulating layer included in a gate capacitor of the transistor 300 so that $\in r2$ can be set to 3 to 4. Combination of such structures enables higher integration of the semiconductor device according to the disclosed invention.

Note that an n-channel transistor in which electrons are majority carriers is used in the above description; it is needless to say that a p-channel transistor in which holes are majority carriers can be used instead of the n-channel transistor.

As described above, a semiconductor device according to an embodiment of the disclosed invention has a nonvolatile memory cell including a writing transistor where a leakage current (off current) between a source electrode and a drain electrode is small in an off state, a reading transistor formed of a semiconductor material different from that of the writing transistor, and a capacitor.

The off current of the writing transistor is preferably 100 zA ($1 \times 10^{-19}$ A) or less, more preferably 10 zA ($1 \times 10^{-20}$ A) or less, still more preferably 1 zA ($1 \times 10^{-21}$ A) or less at a temperature at which the memory cell is used (e.g., 25° C.). Such small off-state current is difficult to obtain with a general silicon semiconductor, but can be achieved by a transistor which is obtained by processing an oxide semiconductor under an appropriate condition. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, rising of a writing pulse given to the floating gate portion FG can be very sharp. Further, an off current is small and thus the amount of charge held in the floating gate portion FG can be reduced. That is, by using a transistor including an oxide semiconductor, rewriting of data can be performed at high speed.

Although there is no limitation on the off-state current of the reading transistor, a transistor that operates at high speed is preferably used as the reading transistor in order to increase the readout speed. For example, a transistor with a switching rate of 1 nano second or lower is preferably used as the reading transistor.

Data is written to the memory cell by turning on the writing transistor so that a potential is supplied to the floating gate portion FG where one of a source electrode and a drain electrode of the writing transistor, one of electrodes of the capacitor, and a gate electrode of the reading transistor are electrically connected, and then turning off the writing transistor so that the predetermined amount of charge is held in the floating gate portion FG. Here, the off current of the writing transistor is very small; thus, the charge supplied to the floating gate portion FG is held for a long time. When an off current is, for example, substantially 0, refresh operation needed for a conventional DRAM can be unnecessary or the frequency of refresh operation can be significantly low (for example, about once a month or a year). Accordingly, power consumption of a semiconductor device can be reduced sufficiently.

Further, data can be rewritten directly by overwriting of new data to the memory cell. For that reason, erasing operation which is necessary for a flash memory or the like is not needed, so that a reduction in operation speed because of erasing operation can be prevented. In other words, high-speed operation of the semiconductor device can be realized. Moreover, a high voltage necessary for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower or 3 V or lower, preferably, 3V or lower in each memory cell in the case where data of two stages (one bit) is written.

The memory cell provided in the semiconductor device according to the disclosed invention may include at least the writing transistor, the reading transistor, and the capacitor. Further, the memory cell can operate even when the area of the capacitor is small. Accordingly, the area of each memory cell can be sufficiently small as compared to an SRAM which requires six transistors in each memory cell, for example; thus, the memory cells can be arranged in a semiconductor device at high density.

In a conventional floating gate transistor, charge travels in a gate insulating film (tunnel insulating film) during writing operation, so that deterioration of the gate insulating film (tunnel insulating film) cannot be avoided. In contrast, in the memory cell according to an embodiment of the present invention, data is written by switching operation of a writing transistor; therefore, there is no deterioration of a gate insulating film. This means that there is no limit on the number of times of writing in principle and writing durability is very high. For example, in the memory cell according to one embodiment of the present invention, the current-voltage characteristic is not degraded even after data is written $1 \times 10^9$ or more times (one billion or more times).

Further, in the case of using a transistor including an oxide semiconductor as the writing transistor of the memory cell, the current-voltage characteristic of the memory cell is not degraded even at, for example, a high temperature of 150° C. because an oxide semiconductor generally has a wide energy gap (e.g., 3.0 to 3.5 eV in the case of an In—Ga—Zn—O-based oxide semiconductor) and extremely few thermally excited carriers.

As a result of intensive research, the present inventors have succeeded in finding for the first time that a transistor including an oxide semiconductor has excellent characteristics in that the characteristics do not deteriorate even at a high temperature of 150° C. and off current is less than or equal to 100 zA, which is extremely small. According to this embodiment, a semiconductor device having a novel feature by using a transistor having such excellent characteristics as the writing transistor of the memory cell is provided.

According to an embodiment of the disclosed invention, a transistor including an oxide semiconductor can achieves miniaturization while defects are suppressed and favorable characteristics are maintained. By using such a transistor, an excellent memory device as described above can be highly-integrated.

The structures, methods, and the like described in this embodiment can be combined as appropriate with any of the structures, methods, and the like described in the other embodiments.

(Embodiment 4)

In this embodiment, application examples of a semiconductor device according to one embodiment of the disclosed invention will be described with reference to FIGS. 7A and 7B, and FIGS. 8A to 8C.

Figure 7A:
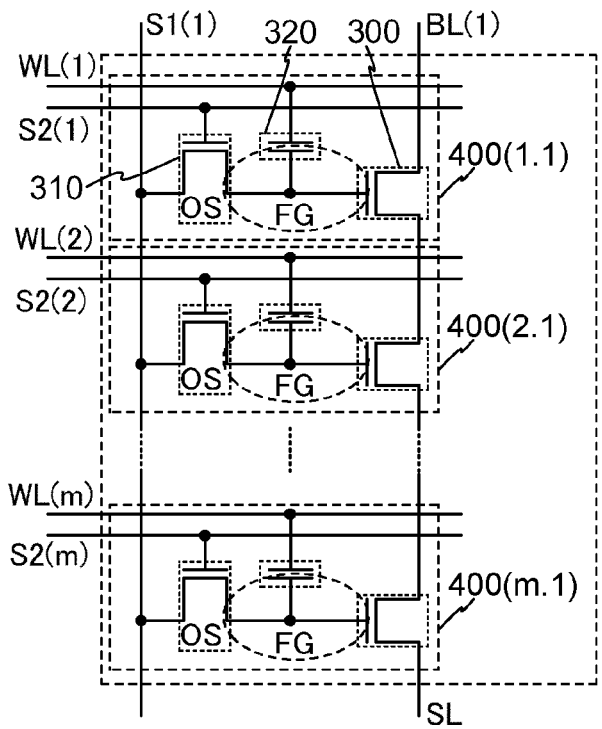
FIGS. 7A and 7B illustrate examples of a circuit diagram of a semiconductor device.
Figure 7B:
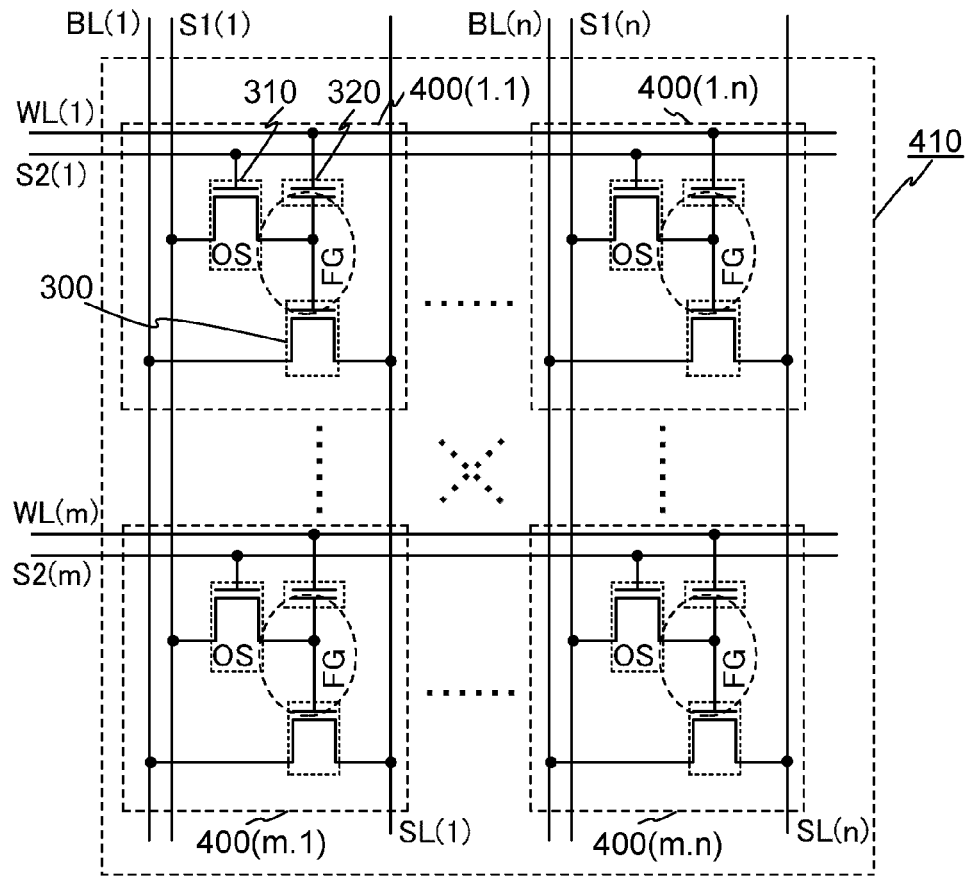

FIGS. 7A and 7B are circuit diagrams of semiconductor devices each including a plurality of semiconductor devices (hereinafter also referred to as memory cells 400) illustrated in FIG. 6A-1. FIG. 7A is a circuit diagram of a so-called NAND semiconductor device in which the memory cells 400 are connected in series, and FIG. 7B is a circuit diagram of a so-called NOR semiconductor device in which the memory cells 400 are connected in parallel.

The semiconductor device in FIG. 7A includes a source line SL, a bit line BL, a first signal line S1, m second signal lines S2, m word lines WL, and a plurality of memory cells 400 (1, 1) to 400 (m, 1) which is arranged in m (rows) (in a vertical direction)×1 (a column) (in a horizontal direction). Note that in FIG. 7A, one source line SL and one bit line BL are provided in the semiconductor device; however, one embodiment of the disclosed invention is not limited to this. n source lines SL and n bit lines BL may be provided so that a memory cell array where the memory cells are arranged in a matrix of m (rows) (in a vertical direction)×n (columns) (in a horizontal direction) is formed.

In each of the memory cells 400, the gate electrode of the transistor 300, the one of the source electrode and the drain electrode of the transistor 310, and the one of the electrodes of the capacitor 320 are electrically connected to one another. In addition, the first signal line S1 and the other of the source electrode and the drain electrode of the transistor 310 are electrically connected to each other, and the second signal line S2 and the gate electrode of the transistor 310 are electrically connected to each other. The word line WL and the other of the electrodes of the capacitor 320 are electrically connected to each other.

Further, the source electrode of the transistor 300 in the memory cell 400 is electrically connected to the drain electrode of the transistor 300 in one adjacent memory cell 400. The drain electrode of the transistor 300 included in the memory cell 400 is electrically connected to the source electrode of the transistor 300 in another adjacent memory cell 400. Note that the drain electrode of the transistor 300 included in the memory cell 400 of the plurality of memory cells connected in series, which is provided at one of ends, is electrically connected to the bit line. The source electrode of the transistor 300 included in the memory cell 400 of the plurality of memory cells connected in series, which is provided at the other end, is electrically connected to the source line.

In the semiconductor device in FIG. 7A, writing operation and reading operation are performed for each row. The writing operation is performed as follows. A potential at which the transistor 310 is turned on is applied to the second signal line S2 of a row where writing is to be performed, whereby the transistor 310 of the row where writing is to be performed is turned on. Accordingly, a potential of the first signal line S1 is applied to the gate electrode of the transistor 300 of the specified row, whereby predetermined charge is given to the gate electrode of the transistor 300. Thus, data can be written to the memory cell of the specified row.

The reading operation is performed as follows. First, a potential at which the transistor 300 is turned on regardless of the charge in the gate electrode of the transistor 300 is applied to the word lines WL of rows other than a row where reading is to be performed, whereby the transistors 300 of the rows other than the row where reading is to be performed are turned on. Then, a potential (a read-out potential) at which an on state or an off state of the transistor 300 is determined depending on the charge in the gate electrode of the transistor 300 is applied to the word line WL of the row where reading is performed. After that, a constant potential is applied to the source line SL and a read-out circuit (not illustrated) connected to the bit line BL is operated. Here, since the plurality of transistors 300 between the source line SL and the bit line BL are in an on state except the transistors 300 of the row where reading is performed, conductance between the source line SL and the bit line BL is determined by the state of the transistor 300 (on state or off state) of the row where reading is performed. Since the conductance of the transistors varies depending on the charge in the gate electrode of the transistor 300, a potential of the bit line BL varies accordingly. By reading the potential of the bit line BL with the read-out circuit, data can be read out from the memory cells of the specified row.

The semiconductor device illustrated in FIG. 7B includes n source lines SL, n bit lines BL, n first signal lines S1, m second signal lines S2, m word lines WL, and a memory cell array 410 including the plurality of memory cells 400 (1, 1) to 400 (m, n) which are arranged in a matrix of m (rows) (in a vertical direction)×n (columns) (in a horizontal direction). The gate electrode of the transistor 300, the one of the source electrode and drain electrode of the transistor 310, and the one electrode of the capacitor 320 are electrically connected to one another. In addition, the source line SL and the source electrode of the transistor 300 are electrically connected to each other, and the bit line BL and the drain electrode of the transistor 300 are electrically connected to each other. In addition, the first signal line 51 and the other of the source electrode and drain electrode of the transistor 310 are electrically connected to each other, and the second signal line S2 and the gate electrode of the transistor 310 are electrically connected to each other. The word line WL and the other electrode of the capacitor 320 are electrically connected.

In the semiconductor device in FIG. 7B, writing operation and reading operation are performed in each row. The writing operation is performed in a manner similar to that of the semiconductor device in FIG. 7A. The reading operation is performed as follows. First, a potential at which the transistor 300 is turned off regardless of charge given to the gate electrode thereof is supplied to the word lines WL of the rows other than the row where reading is to be performed, whereby the transistors 300 of the rows other than the row where reading is to be performed are turned off. Then, a potential (a read-out potential) at which an on state or an off state of the transistor 300 is determined depending on charge in the gate electrode of the transistor 300 is supplied to the word line WL of the row where reading is to be performed. After that, a constant potential is supplied to the source line SL so that a read-out circuit (not illustrated) connected to the bit line BL is operated. Here, conductance between the source line SL and the bit line BL is determined by the state of the transistor 300 of the row where reading is performed. That is, a potential of the bit line BL which is read out by the read-out circuit changes depending on the charge in the gate electrode of the transistor 300 of the row where reading is performed. Thus, data can be read out from to the memory cell of the specified row.

Although the amount of data which can be stored in each of the memory cells 400 is one bit in the above description, the structure of the memory device of this embodiment is not limited to this. The amount of data which is stored in each of the memory cells 400 may be increased by preparing three or more potentials to be supplied to the gate electrode of the transistor 300. For example, in the case where the number of potentials to be supplied to the gate electrode of the transistor 300 is four, data of two bits can be stored in each of the memory cells.

Next, examples of read-out circuit which can be used for the semiconductor devices in FIGS. 7A and 7B, or the like will be described with reference to FIGS. 8A to 8C.

Figure 8A:
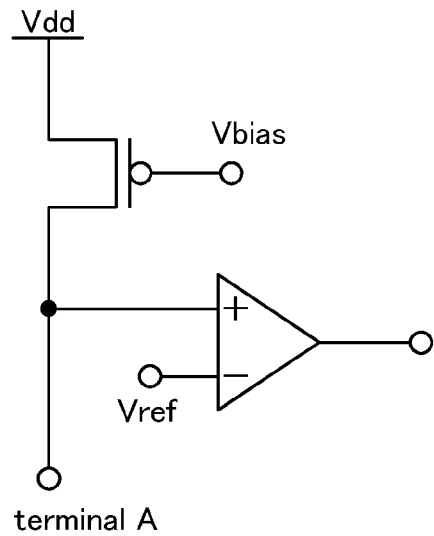
FIGS. 8A to 8C illustrate examples of a circuit diagram of a semiconductor device.

FIG. 8A illustrates a schematic view of the read-out circuit. The read-out circuit includes a transistor and a sense amplifier circuit.

At the time of reading data, a terminal A is connected to a bit line to which a memory cell from which data is to be read is connected. Further, a bias potential Vbias is applied to a gate electrode of the transistor to control a potential of the terminal A.

The resistance of the memory cell 400 changes depending on stored data. Specifically, when the transistor 300 in the selected memory cell 400 is on, the memory cell 400 has a low resistance, whereas when the transistor 300 in the selected memory cell 400 is off, the memory cell 400 has a high resistance.

When the memory cell has a high resistance, a potential of the terminal A is higher than a reference potential Vref and the sense amplifier circuit outputs a potential corresponding to the potential of the terminal A. On the other hand, when the memory cell has a low resistance, the potential of the terminal A is lower than the reference potential Vref and the sense amplifier circuit outputs a potential corresponding to the potential of the terminal A.

Thus, by using the read-out circuit, data can be read out from the memory cell. Note that the read-out circuit of this embodiment is one of examples. Another circuit may be used. The reading circuit may further include a precharge circuit. Instead of the reference potential Vref, a reference bit line may be connected to the sense amplifier circuit.

Figures 8B, 8C:
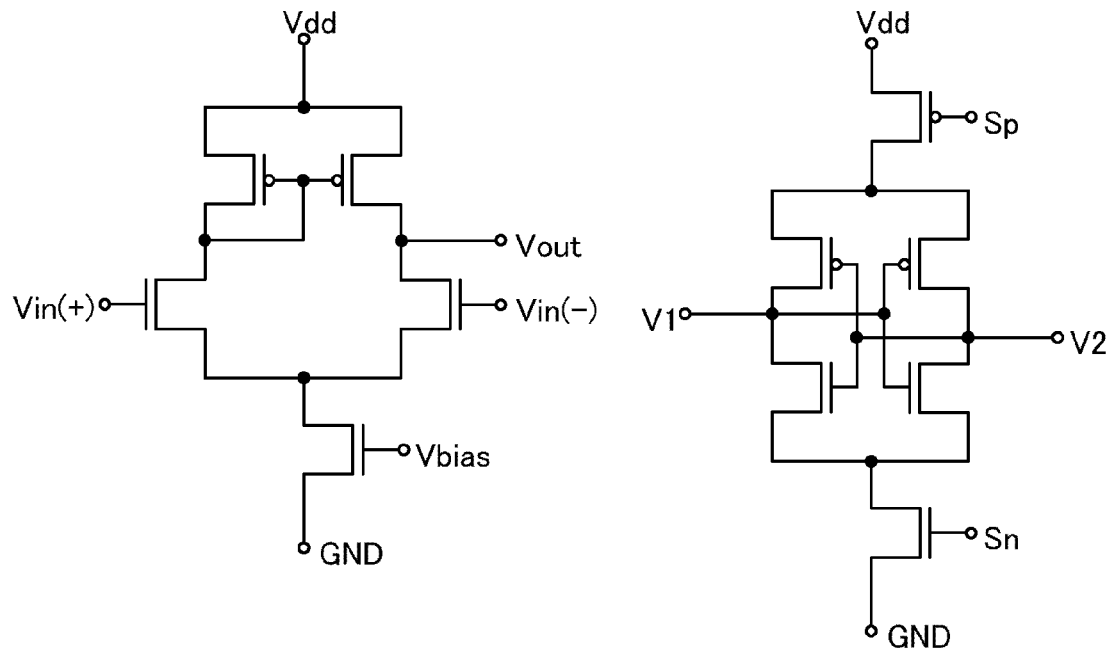

FIG. 8B illustrates a differential sense amplifier which is an example of sense amplifier circuits. The differential sense amplifier has an input terminal Vin(+) and an input terminal Vin(−), and an output terminal Vout, and amplifies the difference between Vin(+) and Vin(−). When Vin(+)>Vin(−), output of the Vout is substantially High, whereas when Vin(+)<Vin(−), the output of the Vout is substantially Low. In the case where the differential sense amplifier is used for the read-out circuit, one of Vin(+) and Vin(−) is connected to the terminal A, and the reference potential Vref is applied to the other of Vin(+) and Vin(−).

FIG. 8C illustrates a latch sense amplifier which is an example of a sense amplifier circuit. The latch sense amplifier includes input/output terminals V1, and V2, an input terminal of a control signal Sp, and an input terminal of a control signal Sn. First, the control signals Sp and Sn are set to High and Low, respectively, and a power supply potential (Vdd) is cut off. Then, potentials to be compared are applied to V1 and V2. After that, the signals Sp and Sn are set to Low and High, respectively, and a power supply potential (Vdd) is applied. If the potentials V1in and V2 in to be compared satisfy V1in>V2 in, output of the V1 is High and output of the V2 is Low, whereas if the potentials satisfy V1in<V2 in, the output of V1 is Low and the output of V2 is High. By utilizing such a relation, the difference between V1in and V2 in can be amplified. When the latch sense amplifier is used for the read-out circuit, one of V1 and V2 is connected to the terminal A and the output terminal through a switch, and the reference potential Vref is applied to the other of V1 and V2.

The methods and structures described in this embodiment can be combined as appropriate with any of the methods and structures described in the other embodiments.

(Embodiment 5)

In this embodiment, the case where the semiconductor device described in any of embodiments 1 to 4 is applied to an electronic device will be described with reference to FIGS. 9A to 9F. In this embodiment, the case where the semiconductor device described in any of embodiments 1 to 4 is applied to an electronic device such as a computer, a mobile phone (also referred to as a mobile telephone or a mobile telephone device), a portable information terminal (including a portable game console, an audio player, and the like), a digital camera, a digital video camera, an electronic paper, or a television device (also referred to as a television or a television receiver) will be described.

Figure 9A:
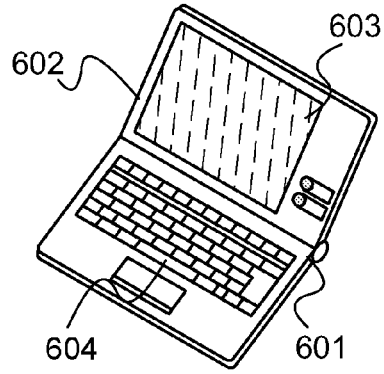
FIGS. 9A to 9F illustrate examples of an electronic device.
Figure 9D:
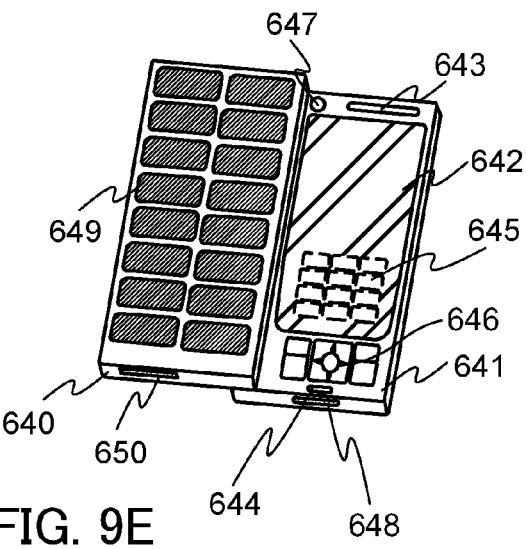

FIG. 9A is a notebook personal computer including a housing 601, a housing 602, a display portion 603, a keyboard 604, and the like. The semiconductor device described in any of the above embodiments is provided in the housing 601 and the housing 602. Therefore, the notebook personal computer which is downsized, with high speed operation and lower power consumption is realized.

Figure 9B:
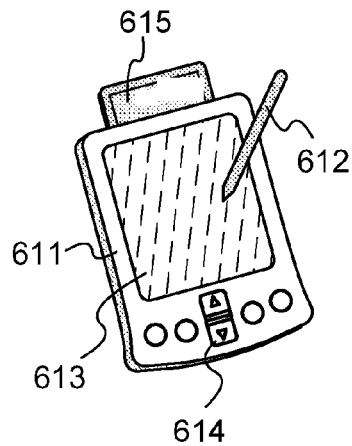

FIG. 9B is a portable information terminal (personal digital assistance (PDA)). A main body 611 is provided with a display portion 613, an external interface 615, operation buttons 614, and the like. Further, a stylus 612 for operating the portable information terminal or the like is also provided. The miniaturized semiconductor device described in any of the above embodiments is provided in the main body 611. Therefore, the portable information terminal which is downsized, with high speed operation and lower power consumption is realized.

Figure 9E:
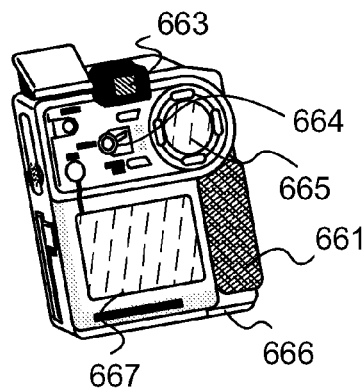
Figure 9C:
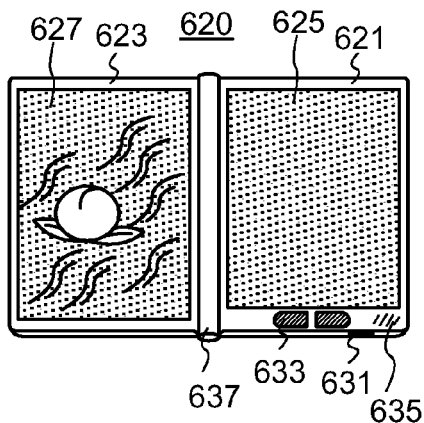

FIG. 9C is an e-book reader 620 mounting an electronic paper. The e-book reader has two housings, a housing 621 and a housing 623. The housing 621 and the housing 623 are provided with a display portion 625 and a display portion 627, respectively. The housing 621 and the housing 623 are connected by a hinge 637 and can be opened and closed along the hinge 637. Further, the housing 621 is provided with a power switch 631, operation keys 633, a speaker 635, and the like. At least one of the housing 621 and the housing 623 is provided with the miniaturized semiconductor device described in any of the above embodiments. Therefore, the e-book reader which is downsized, with high speed operation and lower power consumption is realized.

FIG. 9 D is a mobile phone including two housings, a housing 640 and a housing 641. Further, the housing 640 and the housing 641 in a state where they are developed as illustrated in FIG. 9D can shift by sliding so that one is lapped over the other; therefore, the size of the mobile phone can be reduced, which makes the mobile phone suitable for being carried. The housing 641 is provided with a display panel 642, a speaker 643, a microphone 644, a pointing device 646, a camera lens 647, an external connection terminal 648, and the like. The housing 640 is provided with a solar cell 649 that charges the mobile phone, an external memory slot 650, and the like. In addition, an antenna is incorporated in the housing 641. At least one of the housing 640 and the housing 641 is provided with the miniaturized semiconductor device described in any of the above embodiments. Therefore, the mobile phone which is downsized, with high speed operation and lower power consumption is realized.

FIG. 9E is a digital camera including a main body 661, a display portion 667, an eyepiece 663, an operation switch 664, a display portion 665, a battery 666, and the like. The miniaturized semiconductor device described in any of the above embodiments is provided in the main body 661. Therefore, the digital camera which is downsized, with high speed operation and lower power consumption is realized.

Figure 9F:
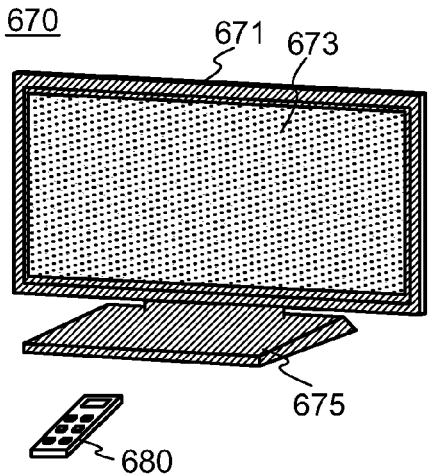

FIG. 9F is a television device 670 including a housing 671, a display portion 673, a stand 675, and the like. The television device 670 can be operated by an operation switch of the housing 671 or a separate remote control 680. The miniaturized semiconductor device described in any of the above embodiments is mounted in the housing 671 and the remote control 680. Therefore, the television device which is downsized, with high speed operation and lower power consumption is realized.

Thus, the semiconductor device according to any of the above embodiments is mounted on the electronic devices described in this embodiment. Accordingly, electronic devices which are down sized, with high speed operation and lower power consumption are realized.

EXAMPLE 1

In this example, the results of computational verification of characteristics of the semiconductor device according to an embodiment of the present invention will be described with reference to FIGS. 10A and 10B, FIGS. 11A and 11B, FIGS. 12A and 12B, and FIG. 13. Specifically, characteristics of transistors each having a different channel length L were compared. Note that a device simulation software "Atlas" manufactured by Silvaco Inc. was used for the calculation.

Figure 10A:
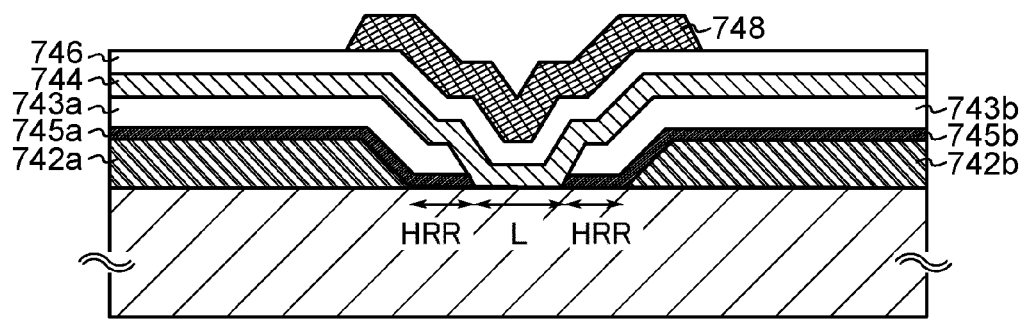
FIGS. 10A and 10B are cross-sectional views each illustrating a model of a transistor used for the simulation.
Figure 10B:
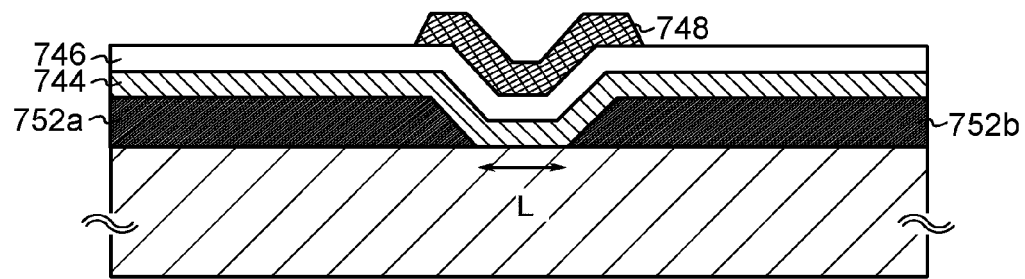

FIGS. 10A and 10B illustrate structures of transistors which were used for the calculation. FIG. 10A illustrates a structure according to one embodiment of the present invention (a structure in which part of a source electrode or a drain electrode is extended), and FIG. 10B illustrates a structure for comparison (a structure in which part of a source electrode or a drain electrode is not extended).

The detail of the transistors used for the calculation is described. The transistor illustrated in FIG. 10A includes a source electrode in which a first conductive layer 742a (material: titanium, thickness: 100 nm) and a second conductive layer 745a (material: titanium nitride, thickness: arbitrary set) are stacked in this order; a drain electrode in which a first conductive layer 742b (material: titanium, thickness: 100 nm) and a second conductive layer 745b (material: titanium nitride, thickness: arbitrary set) are stacked in this order; an insulating layer 743a (material: silicon oxide, thickness: 100 nm) provided over the source electrode; an insulating layer 743b (material: silicon oxide, thickness: 100 nm) provided over the drain electrode; an oxide semiconductor layer 744 (material: In—Ga—Zn—O-based oxide semiconductor, thickness: 10 nm) provided over the insulating layers 743a and 743b; a gate insulating layer 746 (material: hafnium oxide, thickness: 10 nm) provided over the oxide semiconductor layer 744; and a gate electrode 748 (material: tungsten) provided over the gate insulating layer 746.

In the transistor illustrated in FIG. 10A, the second conductive layer 745a has a region which extends in the channel length direction from an end portion of the first conductive layer 742a (that is, an end portion of the second conductive layer 745a is closer to a channel formation region than an end portion of the first conductive layer 742a), and the end portion of the second conductive layer 745a is in contact with the channel formation region of the oxide semiconductor layer 744. Similarly, the second conductive layer 745b has a region which extends in the channel length direction from an end portion of the first conductive layer 742b (that is, an end portion of the second conductive layer 745b is closer to the channel formation region than an end portion of the first conductive layer 742b), and the end portion of the second conductive layer 745b is in contact with the channel formation region of the oxide semiconductor layer 744.

The transistor illustrated in FIG. 10B includes a source electrode (material: titanium nitride, thickness: 100 nm) and a drain electrode (material: titanium nitride, thickness: 100 nm) including a conductive layer 752a and a conductive layer 752b, respectively; the oxide semiconductor layer 744 (material: In—Ga—Zn—O-based oxide semiconductor, thickness: 10 nm) over the source electrode and the drain electrode; the gate insulating layer 746 (material: hafnium oxide, thickness: 10 nm) provided over the oxide semiconductor layer 744; and the gate electrode 748 (material: tungsten) provided over the gate insulating layer 746.

The difference between FIGS. 10A and 10B is the existences of the region which extends in a channel length direction from the end portion of the first conductive layer 742a in the second conductive layer 745a, the region which extends in a channel length direction from the end portion of the first conductive layer 742b in the second conductive layer 745b, and the insulating layer over the source electrode and the insulating layer over the drain electrode.

In FIG. 10A, the region (the region formed of the second conductive layer) which extends in the channel length direction from the end portion of the first conductive layer 742a in the second conductive layer 745a has smaller thickness of the electrode than the other region (the region formed of a stacked-layer of the first conductive layer and the second conductive layer). That is, the area of the cross section perpendicular to the flow of the charge becomes small. The resistance is inversely proportional to the area of the cross section; therefore, the region which extends in the channel length direction from the end portion of the first conductive layer 742a in the second conductive layer 745a has higher resistance than other regions. The same can be said for the second conductive layer 745b. Hereinafter, in this example, the region which extends in the channel length direction from the end portion of the first conductive layer 742a in the second conductive layer 745a, and the region which extends in the channel length direction from the end portion of the first conductive layer 742b in the second conductive layer 745b are referred to as high-resistance regions (HRR).

In FIG. 10A, un upper portion of the source electrode is covered with the insulating layer 743a and un upper portion of the drain electrode is covered with the insulating layer 743b; thus, the contact area between each of the source electrode and drain electrode and the oxide semiconductor layer 744 is extremely small (here, only the end portions of the second conductive layers are in contact with the oxide semiconductor layer 744). That is, it can be said that the source electrode and drain electrode has higher resistance regions than other regions in the vicinity of the regions in contact with the channel formation region.

In the above structure (FIGS. 10A and 10B), by changing the channel length (L), how the threshold voltage ($V_{th}$) of the transistor moves was examined. As the channel length (L), the six conditions of 20 nm, 30 nm, 50 nm, 100 nm, 200 nm, and 400 nm were adopted.

Further, by changing the thickness of the second conductive layer, how the threshold voltage ($V_{th}$) of the transistor moves was examined. As the thickness of the second conductive layer (L), the following four conditions were adopted, 3 nm, 10 nm, 50 nm, and 100 nm.

The voltage (Vds) between the source electrode and the drain electrode was set to 1V. In addition, the length in the channel length direction of the high-resistance regions was set to 0.3 μm.

Parameters used for the calculation are given below.

1. an In—Ga—Zn—O-based oxide semiconductor (a material for the oxide semiconductor layer), a band gap Eg: 3.15 eV, an electron affinity χ: 4.3 eV, a relative dielectric constant: 15, an electron mobility: 10 cm$^2$/Vs, and effective density of states in the conduction band: $5 \times 10^{18}$ cm$^{-3}$.

2. titanium nitride (a material for the source electrode and drain electrode), a work function $\phi_M$: 3.9 eV, and resistivity ρ: $2.2 \times 10^{-4}$ Ω·cm.

3. hafnium oxide (a material for the gate insulating layer), and a relative dielectric constant: 15.

4. tungsten (a material for the gate electrode), and a work function $\phi_M$: 4.9 eV.

The calculation results are shown in FIGS. 11A and 11B, FIGS. 12A and 12B, and FIG. 13. In FIGS. 11A and 11B, FIGS. 12A and 12B, and FIG. 13, the horizontal axis represents the channel length L (nm), and the vertical axis represents the amount of shift in the threshold voltage ($\Delta V_{th}$). Note that $\Delta V_{th}$ is calculated on the basis of the threshold voltage when the channel length L is 400 nm.

Figure 11A:
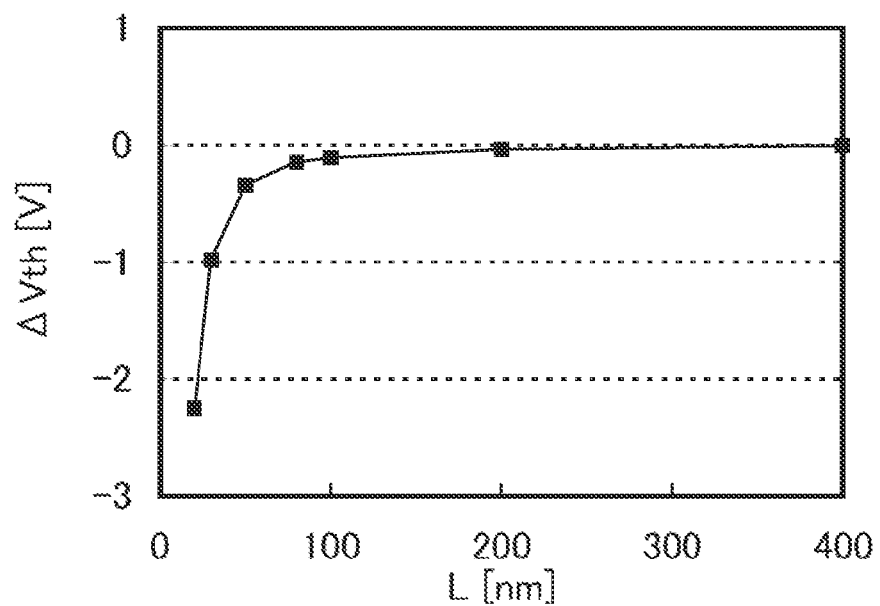
FIGS. 11A and 11B are graphs each showing a relationship between a channel length L (nm) and the amount of shift in threshold voltage ΔVth (V)
Figure 11B:
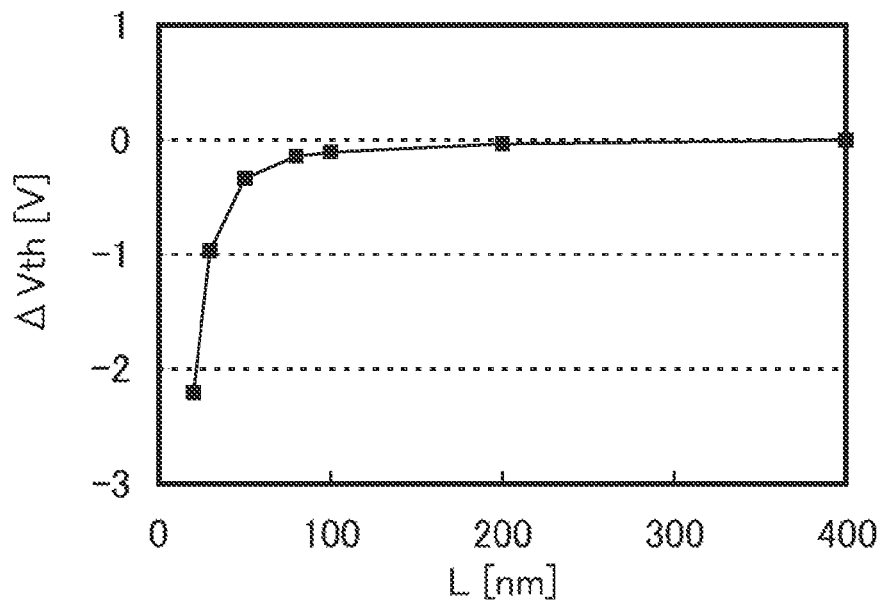
Figure 12A:
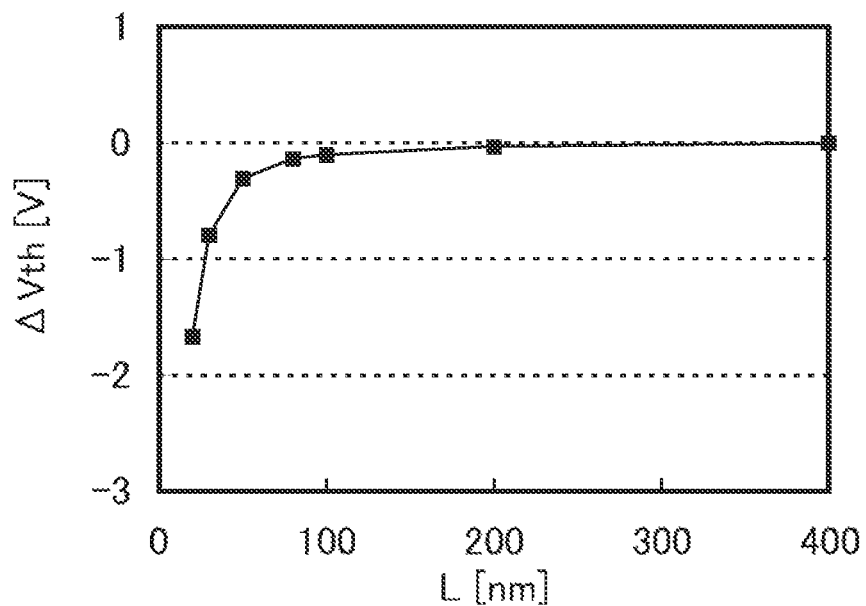
FIGS. 12A and 12B are graphs each showing a relationship between a channel length L (nm) and the amount of shift in threshold voltage ΔVth (V)
Figure 12B:
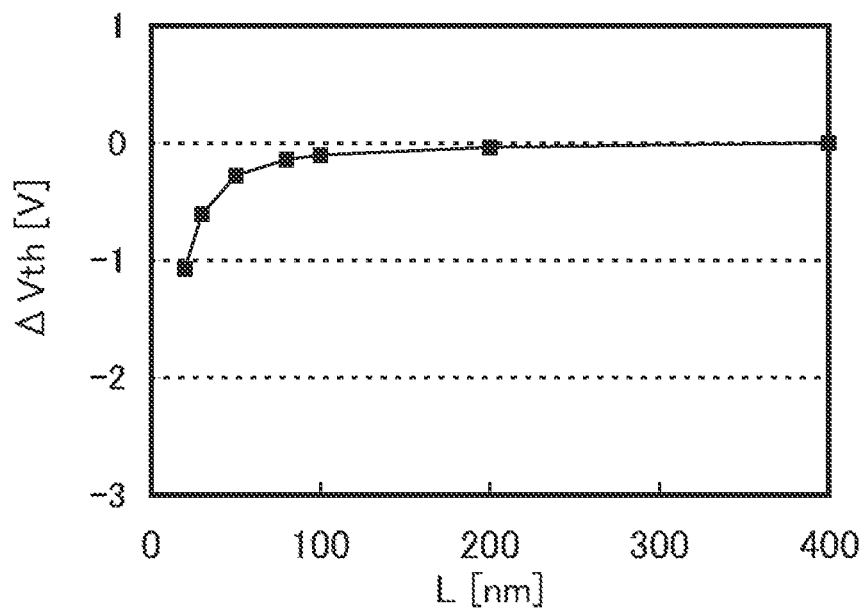
Figure 13:
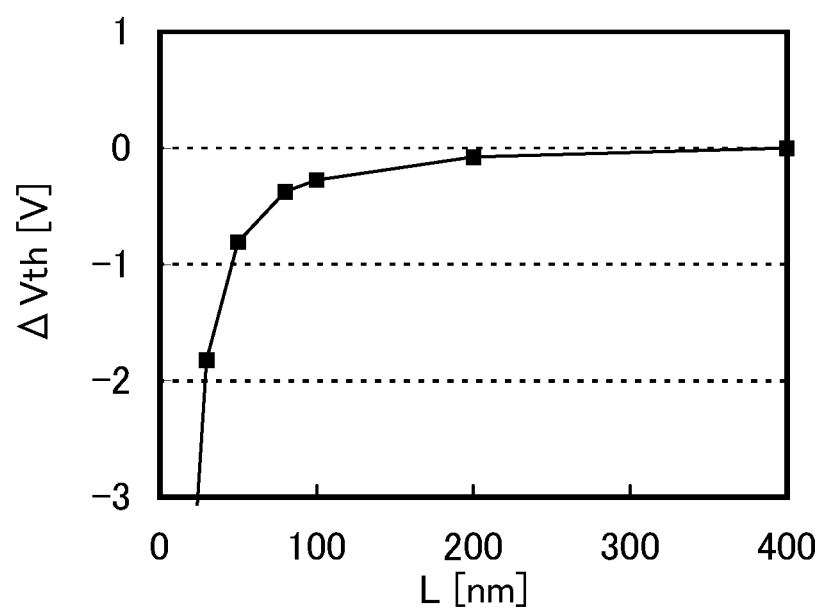
FIG. 13 is a graph showing a relationship between a channel length L (nm) and the amount of shift in threshold voltage ΔVth (V).

FIGS. 11A and 11B, and FIGS. 12A and 12B show calculation results of the structure illustrated in FIG. 10A. FIG. 11A shows a calculation result when the thickness of the second conductive layer is 100 nm, FIG. 11B shows a calculation result when the thickness of the second conductive layer is 50 nm, FIG. 12A shows a calculation result when the thickness of the second conductive layer is 10 nm, and FIG. 12B shows a calculation result when the thickness of the second conductive layer is 3 nm. FIG. 13 shows a calculation result of the structure illustrated in FIG. 10B.

By comparison of FIGS. 11A and 11B, and FIGS. 12A and 12B, it is found that, as the second conductive film is thinner, minus shift of the threshold voltage can be suppressed. Further, by comparison of FIG. 11A and FIG. 13, it is found that the minus shift of $V_{th}$ is suppressed when the insulating layer which covers the source electrode and drain electrode is provided. The above suggests that the short-channel effect can be controlled by reducing the contact area between each of the source electrode and drain electrode and the oxide semiconductor layer and increasing contact resistance at a contact interface.

Further, from the above results, in the vicinity of the region in contact with the semiconductor layer, when the resistance of the source electrode and drain electrode is increased, an effect of controlling the short-channel effect can be obtained.

Accordingly, it can be understood that the minus shift of the threshold voltage can be suppressed by making the vicinity of the region where each of the source electrode and drain electrode is in contact with the channel formation region have high resistance (specifically, for example, by making a small cross-sectional area of part of each of the source electrode and drain electrode, and forming the insulating layer which covers the upper portion of each of the source electrode and drain electrode so that the contact area of the source electrode or drain electrode and the oxide semiconductor layer 144 is reduced). This is because the electric field intensity between the source electrode and drain electrode is relieved. As described above, it is suggested that the short-channel effect such as a decrease in a threshold voltage can be suppressed according to an embodiment of the present invention.

This application is based on Japanese Patent Application serial no. 2010-012540 filed with Japan Patent Office on Jan. 22, 2010, the entire contents of which are hereby incorporated by reference.

EXPLANATION of REFERENCE

100: substrate, 142a: first conductive layer, 142b: first conductive layer, 143: insulating film; 143a: insulating layer, 143b: insulating layer, 144: oxide semiconductor layer, 145: conductive film, 145a: second conductive layer, 145b: second conductive layer, 146: gate insulating layer, 148: gate electrode, 160: transistor, 170: transistor, 180: transistor, 190: transistor, 200: substrate, 242: conductive film, 242a: first conductive layer, 242b: first conductive layer, 243: insulating film, 243a: insulating layer, 243b: insulating layer, 244: oxide semiconductor layer, 245: conductive film, 245a: second conductive layer, 245b: second conductive layer, 246 gate insulating layer, 248: gate electrode, 252: insulating film, 252a: sidewall insulating layer, 252b: sidewall insulating layer, 280: transistor, 300: transistor, 310: transistor, 320: capacitor, 400: memory cell, 410: memory cell array, 601: housing, 602: housing, 603: display portion, 604: keyboard, 611: main body, 612: stylus, 613: display portion, 614: operation button, 615: external interface, 620: e-book reader, 621: housing, 623: housing, 625: display portion, 627: display portion, 631: power switch, 633: operation key, 635: speaker, 637: hinge, 640: housing, 641: housing, 642: display panel, 643: speaker, 644: a microphone, 645: operation key, 646: pointing device, 647: camera lens, 648: an external connection terminal, 649: solar cell, 650: external memory slot, 661: main body, 663: eyepiece, 664: operation switch, 665: display portion, 666: battery, 667: display portion, 670: television device, 671: housing, 673: display portion, 675: stand, 680: remote control, 742a: first conductive layer, 742b: first conductive layer, 743a: insulating layer, 743b: insulating layer, 744: oxide semiconductor layer, 745a: second conductive layer, 745b: second conductive layer, 746: gate insulating layer, 748: gate electrode, 752a: conductive layer.

The invention claimed is:

1. A semiconductor device comprising:
    an oxide semiconductor layer;
    a source electrode in contact with the oxide semiconductor layer comprising:
        a first conductive layer; and
        a second conductive layer;
    a drain electrode in contact with the oxide semiconductor layer comprising:
        a third conductive layer; and
        a fourth conductive layer;
    a gate electrode overlapping with the oxide semiconductor layer; and
    a gate insulating layer provided between the oxide semiconductor layer and the gate electrode,
    wherein the second conductive layer extends beyond an end portion of the first conductive layer,
    wherein the fourth conductive layer extends beyond an end portion of the third conductive layer, and
    wherein the end portion of the first conductive layer and the end portion of the third conductive layer are opposed to each other.

2. The semiconductor device according to claim 1, wherein the first conductive layer, the second conductive layer, the third conductive layer and the fourth conductive layer each has a tapered shape.

3. The semiconductor device according to claim 1, further comprising:
    a first sidewall insulating layer over the second conductive layer and in contact with the end portion of the first conductive layer; and
    a second side wall insulating layer over the fourth conductive layer and in contact with the end portion of the third conductive layer.

4. The semiconductor device according to claim 1, wherein a material of the second conductive layer and a material of the fourth conductive layer are a nitride of a metal.

5. The semiconductor device according to claim 1, wherein a thickness of the second conductive layer and a thickness of the fourth conductive layer are from 5 nm to 15 nm.

6. The semiconductor device according to claim 1, further comprising:
    a first insulating layer provided between the oxide semiconductor layer and the source electrode; and
    a second insulating layer provided between the oxide semiconductor layer and the drain electrode,
    wherein the source electrode and the drain electrode are in contact with the oxide semiconductor layer at end portions of the source electrode and the drain electrode.

7. A semiconductor device comprising:
    an oxide semiconductor layer;
    a source electrode comprising:
        a first conductive layer; and
        a second conductive layer in contact with the oxide semiconductor layer;
    a drain electrode comprising:
        a third conductive layer; and
        a fourth conductive layer in contact with the oxide semiconductor layer;
    a gate electrode overlapping with the oxide semiconductor layer; and
    a gate insulating layer provided between the oxide semiconductor layer and the gate electrode,
    wherein the second conductive layer is over the first conductive layer, and the second conductive layer has a higher resistance than the first conductive layer, and
    wherein the fourth conductive layer is over the third conductive layer, and the fourth conductive layer has a higher resistance than the third conductive layer.

8. The semiconductor device according to claim 7, wherein the first conductive layer and the third conductive layer are in contact with the oxide semiconductor layer.

9. The semiconductor device according to claim 7,
    wherein the second conductive layer extends beyond an end portion of the first conductive layer,
    wherein the fourth conductive layer extends beyond an end portion of the third conductive layer, and
    wherein the end portion of the first conductive layer and the end portion of the third conductive layer are opposed to each other.

10. The semiconductor device according to claim 7, wherein the first conductive layer, the second conductive layer, the third conductive layer and the fourth conductive layer each has a tapered shape.

11. The semiconductor device according to claim 7, wherein a material of the second conductive layer and a material of the fourth conductive layer are a nitride of a metal.

12. The semiconductor device according to claim 7, wherein a thickness of the second conductive layer and a thickness of the fourth conductive layer are from 5 nm to 15 nm.

13. The semiconductor device according to claim 7, further comprising:
    a first insulating layer provided between the oxide semiconductor layer and the source electrode; and
    a second insulating layer provided between the oxide semiconductor layer and the drain electrode,
    wherein the source electrode and the drain electrode are in contact with the oxide semiconductor layer at end portions of the source electrode and the drain electrode.

14. A semiconductor device comprising:
    an oxide semiconductor layer;
    a source electrode comprising:
        a first conductive layer; and
        a second conductive layer in contact with the oxide semiconductor layer;
    a drain electrode comprising:
        a third conductive layer; and
        a fourth conductive layer in contact with the oxide semiconductor layer;
    a gate electrode overlapping with the oxide semiconductor layer; and
    a gate insulating layer provided between the oxide semiconductor layer and the gate electrode,
    wherein the first conductive layer is over the second conductive layer, and the second conductive layer has a higher resistance than the first conductive layer, and
    wherein the third conductive layer is over the fourth conductive layer, and the fourth conductive layer has a higher resistance than the third conductive layer.

15. The semiconductor device according to claim 14, wherein the first conductive layer and the third conductive layer are in contact with the oxide semiconductor layer.

16. The semiconductor device according to claim 14,
    wherein the second conductive layer extends beyond an end portion of the first conductive layer,
    wherein the fourth conductive layer extends beyond an end portion of the third conductive layer, and
    wherein the end portion of the first conductive layer and the end portion of the third conductive layer are opposed to each other.

17. The semiconductor device according to claim 14, wherein the first conductive layer, the second conductive layer, the third conductive layer and the fourth conductive layer each has a tapered shape.

18. The semiconductor device according to claim 16, further comprising:
- a first sidewall insulating layer over the second conductive layer and in contact with the end portion of the first conductive layer; and
- a second side wall insulating layer over the fourth conductive layer and in contact with the end portion of the third conductive layer.

19. The semiconductor device according to claim 14, wherein a material of the second conductive layer and a material of the fourth conductive layer are a nitride of a metal.

20. The semiconductor device according to claim 14, wherein a thickness of the second conductive layer and a thickness of the fourth conductive layer are from 5 nm to 15 nm.

21. The semiconductor device according to claim 14, further comprising:
- a first insulating layer provided between the oxide semiconductor layer and the source electrode; and
- a second insulating layer provided between the oxide semiconductor layer and the drain electrode,
- wherein the source electrode and the drain electrode are in contact with the oxide semiconductor layer at end portions of the source electrode and the drain electrode.

22. A semiconductor device comprising:
- an oxide semiconductor layer including a channel formation region;
- a source electrode including a region in contact with the channel formation region;
- a drain electrode including a region in contact with the channel formation region;
- a gate electrode overlapping with the channel formation region; and
- a gate insulating layer provided between the oxide semiconductor layer and the gate electrode,
- wherein the region of the source electrode has a higher resistance than other regions of the source electrode, and
- wherein the region of the drain electrode has a higher resistance than other regions of the drain electrode.

23. The semiconductor device according to claim 22, further comprising:
- a first insulating layer provided between the oxide semiconductor layer and the source electrode; and
- a second insulating layer provided between the oxide semiconductor layer and the drain electrode,
- wherein the source electrode and the drain electrode are in contact with the oxide semiconductor layer at end portions of the source electrode and the drain electrode.

* * * * *